United States Patent [19]

Katoka et al.

[11] Patent Number: 5,011,818
[45] Date of Patent: Apr. 30, 1991

[54] SENSING A MAGNETIC FIELD WITH A SUPER CONDUCTIVE MATERIAL THAT EXHIBITS MAGNETO RESISTIVE PROPERTIES

[75] Inventors: Shoei Katoka, Tokyo; Shuhei Tsuchimoto, Nara; Hideo Nojima, Nara; Ryusuke Kita, Nara; Masaya Nagata, Nara, all of Japan

[73] Assignee: Sharp Kabushiki Kaisha, Osaka, Japan

[21] Appl. No.: 226,067

[22] Filed: Jul. 29, 1988

[30] Foreign Application Priority Data

| Jul. 29, 1987 | [JP] | Japan | 62-189346 |
| Jul. 29, 1987 | [JP] | Japan | 62-189347 |
| Aug. 1, 1987 | [JP] | Japan | 62-193014 |
| Aug. 1, 1987 | [JP] | Japan | 62-193016 |
| Aug. 1, 1987 | [JP] | Japan | 62-193017 |
| Aug. 1, 1987 | [JP] | Japan | 62-193018 |
| Aug. 3, 1987 | [JP] | Japan | 62-194167 |
| Aug. 3, 1987 | [JP] | Japan | 62-194168 |
| Aug. 3, 1987 | [JP] | Japan | 62-194169 |
| Aug. 5, 1987 | [JP] | Japan | 62-195896 |
| Sep. 17, 1987 | [JP] | Japan | 62-233369 |
| Dec. 8, 1987 | [JP] | Japan | 62-310085 |
| Dec. 16, 1987 | [JP] | Japan | 62-319523 |
| Dec. 28, 1987 | [JP] | Japan | 62-333592 |

[51] Int. Cl.$^5$ .................... H01B 12/02; H01L 39/12; H01L 39/16; G01R 33/035
[52] U.S. Cl. .................... 324/248; 324/248; 324/252; 505/702; 338/325
[58] Field of Search ............... 324/207, 208, 248, 252, 324/249, 250, 251, 244, 260, 262, 263; 338/32 R, 32 S; 361/19; 505/1, 841, 842-848, DIG. 701, DIG. 705, DIG. 706, DIG. 711; 307/306

[56] References Cited

U.S. PATENT DOCUMENTS

| 4,596,950 | 6/1986 | Leinhard et al. | 324/252 X |
| 4,660,113 | 4/1987 | Nomura et al. | 324/252 X |

FOREIGN PATENT DOCUMENTS 60-65582 4/1985 Japan.

OTHER PUBLICATIONS

Minami et al., "Temperature Dependence of Anamalous Magnetism or High-To Superconductors . . . ", *Journal of Applied Physics*, May 1987, pp. L783-L784.
Moffat et al., "Temperature Dependence of the Surface Resistivity . . . ", *High Temperature Superconductors II*, Materials Research Society/Symposium, Apr. 5-9, 1988, pp. 347-350.
Sun et al., "Superconductivity and Magnetism in the High-To Superconductor Y-Bg-Ch-O", *Physical Review Letters*, vol. 58, No. 15, Apr. 13, 1987, pp. 1574-1576.
Patent abstract of Japan cited Japanese Document 55-37978 (17 Mar. 1980), p. 115P12, vol. 4, No. 70, (p. 12) (552), 23 May 1980.
Advance Ceramic Materials, vol. 2, No. 38, Jul., 1987, pp. 340-341, Johnson et al., "Preparation of Superconducting Powders by Freeze Drying".
Advance Ceramic Materials, vol. 2, No. 38, Jul. 1987, pp. 612-614, Figs. 1-6, Cook et al., Fracture Properties of Polycrystalline YBa2Cu3OX.
Nature vol. 327, May 28, 1987, Welch et al., "Oxygen Defects and Structure", pp. 278-279.
Nojima et al., *Jap. Journ. of Appl. Phys.*, vol. 27, No. 5, May 1988, pp. 74-78, ("Galvanomagnetic Effect . . . ").
Kita et al., "Highly Sensitive Magnetic . . . ", 5th Internt'l Workshop, Jun. 2-4, 1988, pp. 231-234.
Tsuchimoto et al., "Novel Magnetic Sensor . . . ", published 12/8/87, IEEE, pp. 867-868.

*Primary Examiner*—Reinhard J. Eisenzopf
*Assistant Examiner*—Warren S. Edmonds

[57] ABSTRACT

A superconductive magneto-resistive device is made up of superconductive materials having grain boundaries which act as weak couplings. The superconductive material will change from the superconductive state to the normal state when a magnetic field is applied to the material. The superconductive material can be used in various devices for measuring.

28 Claims, 24 Drawing Sheets

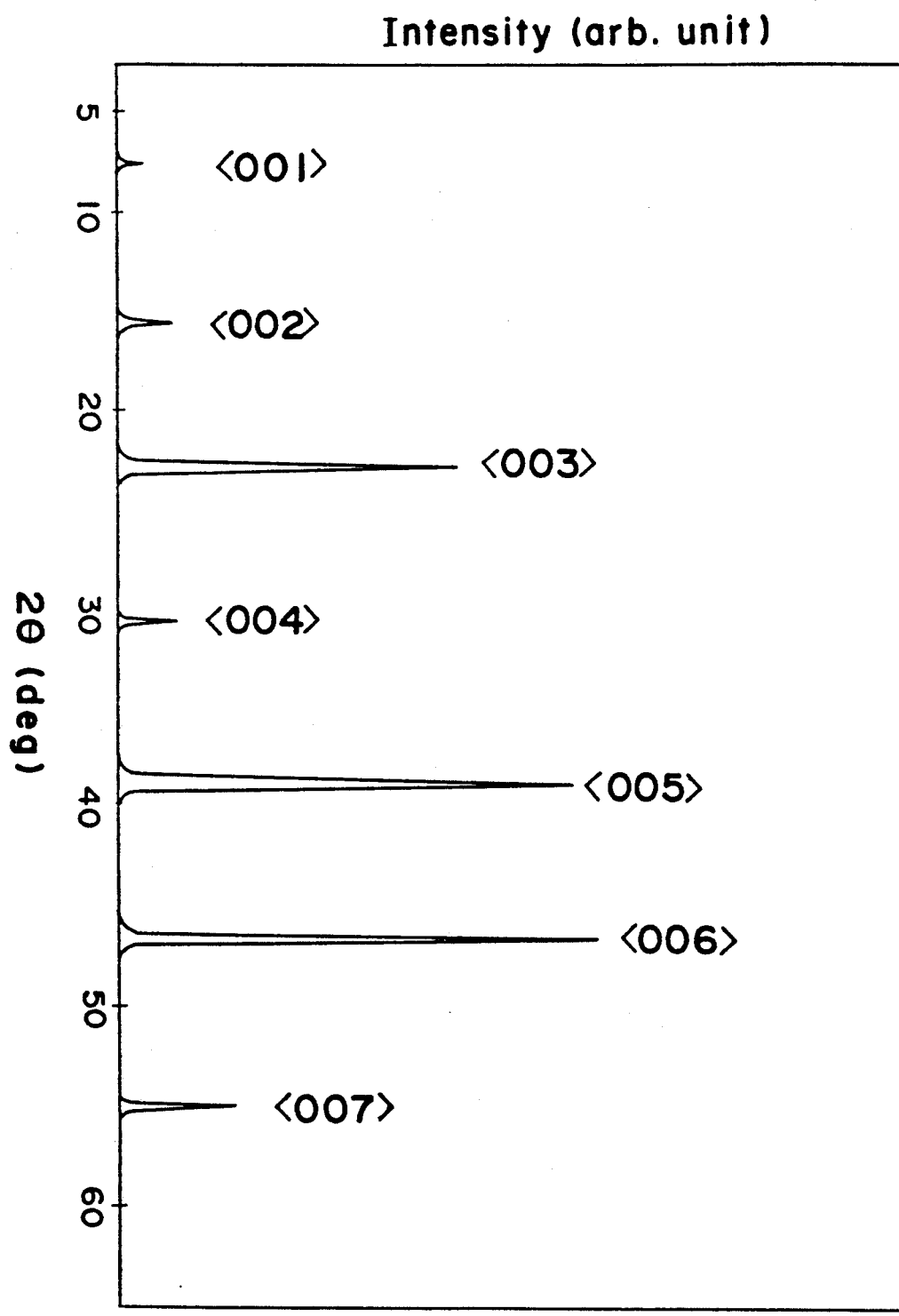

SENSING A MAGNETIC FIELD WITH A SUPER CONDUCTIVE MATERIAL THAT EXHIBITS MAGNETO RESISTIVE PROPERTIES

BACKGROUND OF THE INVENTION

1. Field of the Invention

The present invention relates to a method and device for sensing a magnetic field by using magnetoresistive properties present in a superconductive material having grain boundaries therein.

2. Description of the Prior Art

Conventionally, a magnetic sensor which utilizes the Hall effect or magneto-resistive effect in a semiconductor or a magnetic sensor which utilizes the magneto-resistive effect in a magnetic material is widely used for sensing or measuring a magnetic field. The former sensor has a sensitivity capable of sensing a magnetic field of about $10^{-2}$ gauss and the latter one has a sensitivity capable of sensing a magnetic field of about $10^{-3}$ gauss.

However, these conventional magnetic sensors have various disadvantages as follows.

The conventional sensors have relatively large specific resistances $R_0$ even when no magnetic field is applied to them.

Each variation ratio of resistance to the magnetic field is represented by a parabolic curve having a small coefficient, as shown in FIG. 45 qualitatively.

Since a gain $\Delta R$ in the resistance is increased proportional to the square of the magnetic flux density B of an applied magnetic field, the gain to a weak magnetic field of, for example, several tens gauss is very small and, therefore, a ratio of the gain $\Delta R$ to the proper resistance $R_0$ ($\Delta R/R_0$) is an order of 1% at the most.

On the contrary, a magnetic sensor with use of the SQUID (Superconductive Quantum Interference Device) which utilizes the Josephson junction is known to have a very high sensitivity capable of sensing a very weak magnetic field of about $10^{-10}$ gauss. Structures of tunnel junction, point contact and micro bridge have been known as the Josephson junction.

However, the magnetic sensor of this type has a quite delicate structure in manufacturing and requires a complicated operation to use it. Namely, it is not practical for general use, although it has a very high sensitivity.

SUMMARY OF THE INVENTION

One of the objects of the present invention is to provide a superconductive magneto-resistive device which is sensitive to a weak magnetic field.

Another object of the present invention is to provide method and system utilizing a magneto-resistive property of a superconductive material having grain boundaries.

Another object of the present invention is to provide practical method and system for sensing a magnetic field with a very high sensitivity by utilizing a magneto-resistive property of a superconductive material having random grain boundaries.

Another object of the present invention is to provide a practical magnetic sensor which is relatively easy to manufacture and to handle.

A further object of the present invention is to provide a method and system for controlling the magneto-resistivity of the superconductive magneto-resistive device.

In order to accomplish these objects, according to the first aspect of the present invention, there is provided a method for sensing a magnetic field. The method comprises applying a magnetic field to a superconductive material having grain boundaries and sensing said magnetic field by utilizing a change in the resistance of said superconductive material which is accompanied with a phase transition of said superconductive material from the superconductive phase to the normal conductive phase.

According to the second aspect of the present invention, there is provided a method for sensing a magnetic field which comprises applying a magetic field to a superconductive material having grain boundaries, applying an external magnetic field to a superconductive material having grain boundaries and detecting a change in the resistance of said superconductive material as an indication of said external magnetic field, said change being accompanied with a phase transition of said superconductive material from the superconductive phase to the normal conductive phase.

According to the third aspect of the present invention, there is provided a method for sensing a magnetic field which comprises supplying a current through a superconductive material having grain boundaries, applying a magnetic field to said superconductive material and detecting a change in the resistance of said superconductive material as an indication of said magnetic field, said change being accompanied with a phase transition of said superconductive material from the superconductive phase to the normal conductive phase.

According to the fourth aspect of the present invention, there is provided a superconductive mangetoresistive device comprising a superconductive material having grain boundaries which act as weak couplings and means for utilizing a change in the resistance of said material caused when a magnetic field is applied to said superconductive material, said change being accompanied with a phase transition of said superconductive material from the superconductive phase to the normal conductive phase.

The superconductive magneto-resistive device can be applied to various devices such as magnetic sensors, wave guides, magnetic heads for reading magnetic data recorded on a recording medium, one dimensional, two dimensional or rotation position sensors and the like.

According to the fifth aspect of the present invention, there is provided a system for a superconductive magneto-resistive device comprising a superconductive material having grain boundaries, means for applying a magnetic field to said superconductive material and means for measuring the resistance of said superconductive material as an indication of an external magnetic field applied to said superconductive material, said resistance being accompanied with a phase transition of said superconductive material from the superconductive material from the superconductive phase to the normal conductive phase.

In this system according to the fifth aspect of the present invention, the sensitivity of the device to an external field can be controlled easily by controlling the strength of the magnetic field to be applied to the superconductive material.

According to the sixth aspect of the present invention, there is provided a system for a superconductive magneto-resistive device comprising a superconductive material having grain boudaries, means for supplying an electric current through said superconductive material, means for measuring the resistance of said superconductive material as an indication of an external magnetic field applied to said superconductive material, said resistance being accompanied with a phase transition of said superconductive material from the superconductive material from the superconductive phase to the normal conductive phase.

In this system according to the sixth aspect of the present invention, the sensitivity of the device to an external field is easily controlled by varying the strength of the electric current to be applied to the superconductive material.

In the present invention, there is used a superconductive material such as a ceramic superconductive material which has random grain boundaries 2 among grains 1 as shown in FIG. 1 schematically in an enlarged scale.

The inventors of the present invention discovered a magneto-resistive property of a superconductor having random grain boundaries, as shown in FIG. 1 schematically. Namely, as shown in FIG. 2, the resistance of the superconductor of this type is kept at zero in the superconductive phase until the flux density B of a magnetic field applied thereto is increased up to a threshold value Bth. but it increases very steeply when the flux density B is increased over the threshold value Bth. This implies that the ratio of $\Delta R$ to $R_0$ is infinitively large since the specific resistance $R_0$ of the superconductor is substantially zero.

This phenomenon can be understood by assuming that individual grain boundaries act as weak couplings in the superconductor of this type. Namely, a ceramic superconductor is a crystal having an orthorhomic structure of single phase according to a macroscopic analysis using X-ray diffraction and, when examined with an electron microscope, is a crystal being comprised of superconductive grains and grain boundaries bonding them. These grain boundaries are considered to be formed randomly with an insulative material or an electrically resistant material. This microscopic structure suggests that those random grain boundaries form various weak couplings including tunnel junction type, point contact type and micro bridge type.

If this presumption is correct, a network including a lot of Josephson junctions 3, of various types is considered to be formed in the ceramic superconductor, as shown in FIG. 3. In the superconductive phase thereof, individual Cooper pair of electrons can pass freely through Josephson junction 3 (weak couplings) and, therefore, the resistance becomes zero. When a magnetic field is applied to the superconductor, some of Josephson junction 3 are broken thereby and, therefore, the superconductor has an electric resistance.

The resistance thereof is increased as the number of broken Josephson junctions increases with increase of the magnetic field applied.

It is to be noted that weak couplings are formed by grain boundaries themselves in the superconductor of this type.

This gives a great merit when compared with known weak couplings to be made artificially.

BRIEF DESCRIPTION OF DRAWINGS

These and other objects and features of the present invention will become more apparent when the preferred embodiment of the present invention is described in detail with reference of accompanied drawings in that;

FIGS. 22(a) and 22(b) show one half of another potentiometer for detecting a rotational displacement according to the present invention, wherein FIG. 22(a) is a vertical cross-sectional view thereof and FIG. 22(b) is a cross-sectional view along the line X—X of FIG. 22(a);

FIGS. 23(a) and 23(b) show another half of said another potentiometer, wherein FIG. 23(a) is a vertical cross-sectional view thereof and FIG. 23(b) is a cross-sectional view along the line X—X of FIG. 223(a);

FIG. 44 is a graph showing an X-ray diffraction pattern of the device, manufactured by the method shown in FIG. 42.

DESCRIPTION OF THE PREFERRED EMBODIMENT

As a superconductor having grain boundaries, a Y-Ba-Cu-O ceramic superconductor can be used.

This ceramic superconductor is produced as follows.

Powders of $Y_2O_3$, $BaCO_3$ and $CuO$ are weighed at a predetermined ratio in order to obtain a component of $Y_1Ba_2Cu_3O_{7-x}$. After grinding and mixing these powders, samples formed with the mixture are calcined at 900° C. for 5 hours in air. Then, the samples are crushed and ground into powder comprised of micro particles having a diameter equal to or smaller than 1 μm. Then, the powder is cold-pressed into disk-like pellets of about 9 mm diameter and 1 mm thick with a press force of 1 ton/cm². Finally, these pellets are sintered at 1,000° C. for 3 hours in air and, then, the temperature is gradually lowered to 200° C. for 5 hours.

The superconductor thus produced has an orthorhomic crystal system having a composition of $Y_1Ba_2Cu_3O_{7-x}$ when examined macroscopically with use of X-ray diffraction and, when examined microscopically with use of an electron microscope, is comprised of superconductive grains having grain boundaries which can be deemed as weak couplings formed among superconductive grains.

Figure 1:
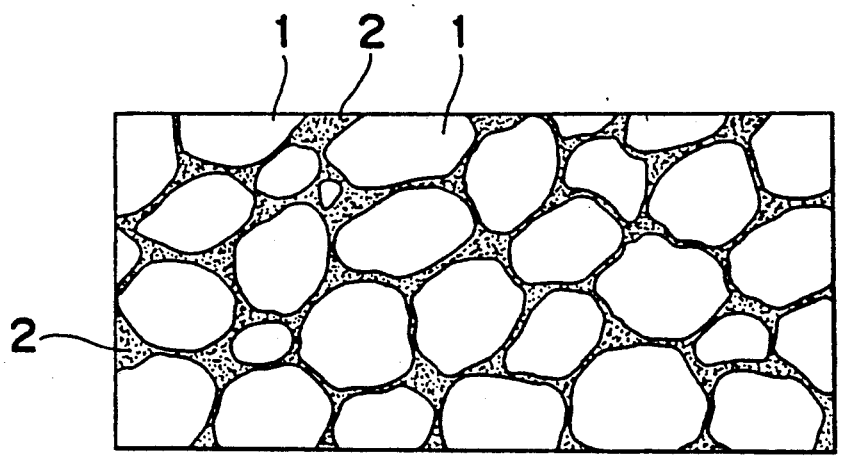
FIG. 1 is an enlarged schematical cross-sectional view of a ceramic/superconductor.
Figure 2:
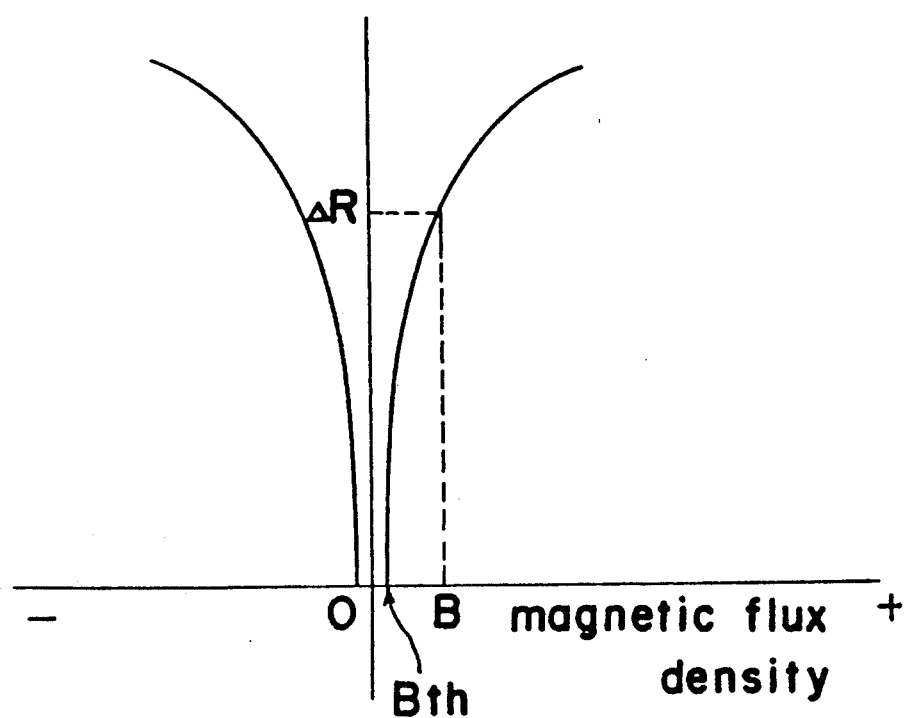
FIG. 2 is a graph showing the magneto-resistive property of a ceramic superconductor according to the present invention.
Figure 3:
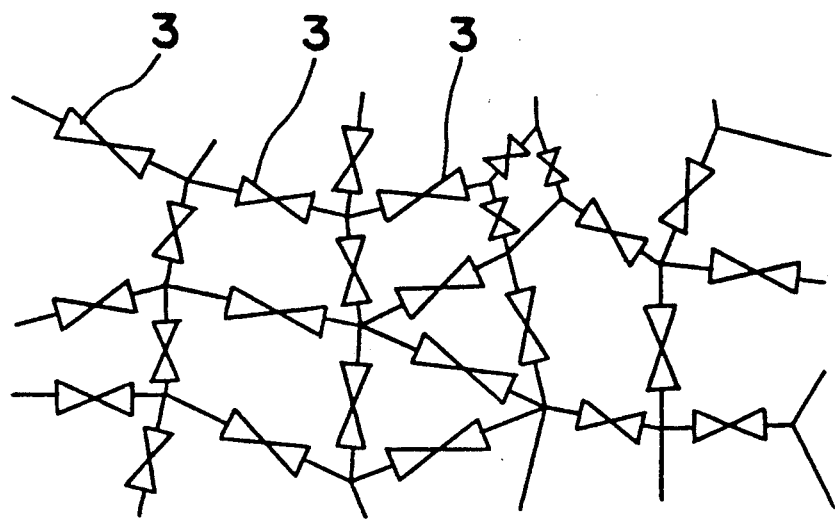
FIG. 3 is a schematic model of the ceramic superconductor for showing a network of weak couplings assumed to be formed therein.
Figure 4:
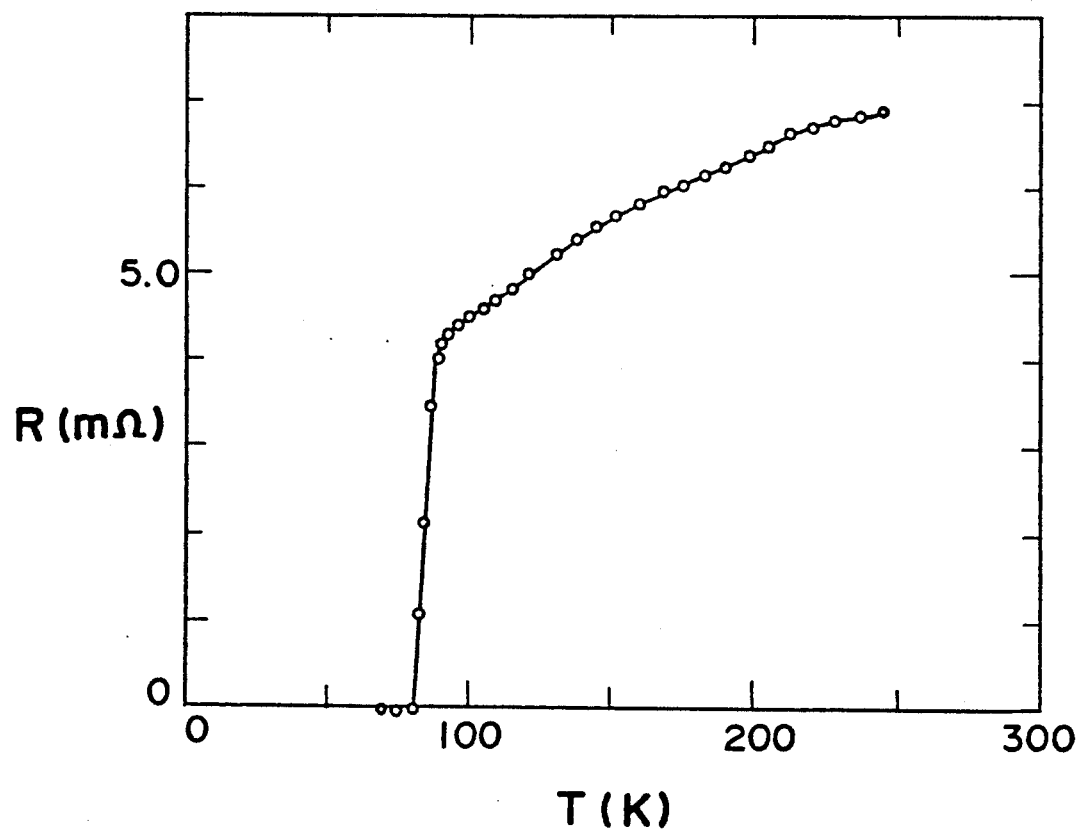
FIG. 4 is a graph showing the resistance property of the ceramic superconductor as a function of the absolute temperature.

As shown in FIG. 4, the electric resistance of the superconductor begins to lower steeply from 97 K and becomes zero at 83 K.

Figure 5:
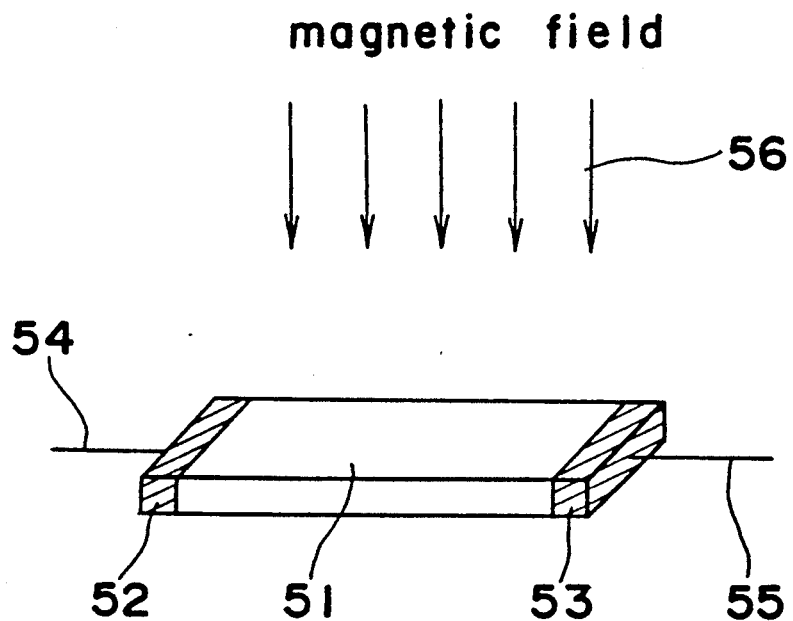
FIG. 5 is a perspective view showing a first preferred embodiment of the present invention.

As shown in FIG. 5, a thin rectangular device 51 of (1×7×0.7 mm) is prepared by cutting a pellet. Electrodes 52 and 53 are formed at each end of the device 51 by evaporating Ti with use of electron beam at a room temperature and at a pressure of about $10^{-6}$ Torr. Leads 54 and 55 are fixed onto Ti electrodes 52 and 53 by Ag paste, respectively. This structure of electrode is very advantageous since Ti shows a tight contact with the superconductor and an excellent ohmic property.

The device 51 is immersed in liquid nitrogen (77 K) and a constant electric current is supplied, via the leads 54, 55 and Ti electrodes 52, 53, by a stablized power source (not shown) in order to measure the electric resistivity of the device 51. The measurement thereof is done by measuring a voltage generated between two Ti electrodes 52 and 53.

When any magnetic field is not applied to the device 51, the device 51 has no resistance.

On the contrary, when a magnetic field 56 is applied to the device 51, while supplying the constant current thereto, a resistance appears suddenly.

Figure 6:
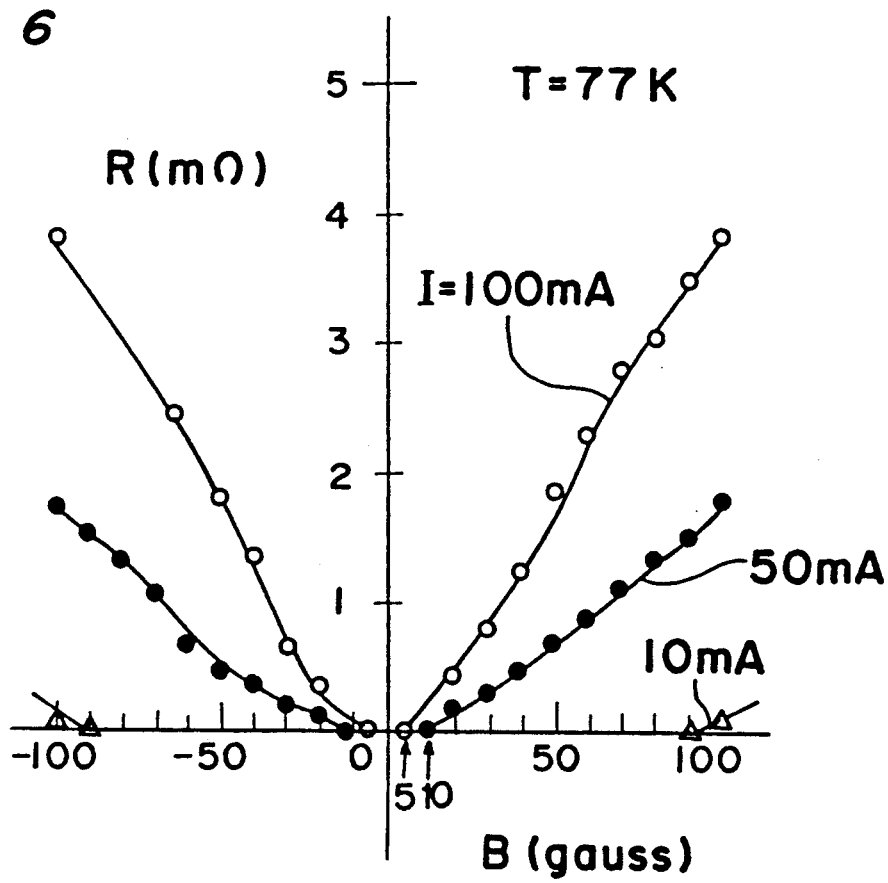
FIG. 6 is a graph showing the magneto-resistive property obtained from the first preferred embodiment of the present invention.

As shown in FIG. 6, it appears when the flux density B of magnetic field is raised up to about 10 gauss while supplying the constant current of 50 mA and increases steeply as the magnetic flux density B increases. When the current is 10 mA, the resistance appears at a flux density B of about 100 gauss. Further, when the current is 100 mA, it appears at a flux density B of about 5 gauss.

The device shows a stable reappearance regarding this property and the latter is not dependent on a direction of application of the magnetic field.

In this specification, the device is referred to the superconductive magneto-resistive device.

This excellent superconductive magneto-resistive property can be applied to various applications in electronic devices. One important application is a magnetic sensor since the device has an excellent sensitivity to the magnetic field. Further, the sensitivity of the device is isotropic because of the randomness of grain boundaries. This property enhances merits as a magnetic sensor since it is impossible to obtain in a conventional magnetic sensor utilizing a magneto-resistive property of a semiconductor or the SQUID.

The device also shows both properties as a digital device and an analogue device since it is critical to the magnetic field and has such a magneto-resistive property that the resistance increases as the intensity of the magnetic field increases. This is also an advantageous feature which is impossible to obtain in a conventional magnetic sensor as mentioned above. This property suggests an application for a magnetic head for picking up a digital or analogue magnetic signal.

Figure 7:
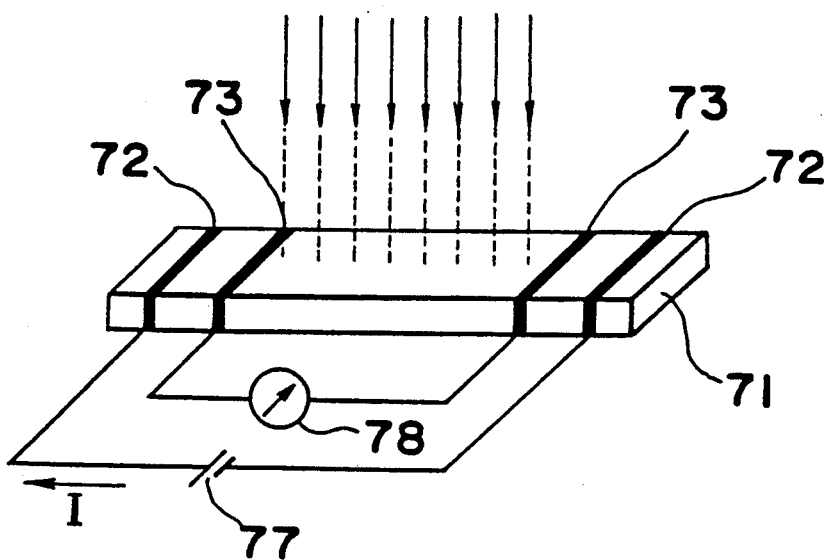
FIG. 7 is a perspective view showing the second preferred embodiment of the present invention.

In order to measure the magnetic field more exactly, it is desirable to form electrodes for supplying a constant current and electrodes for measuring a voltage separately as shown in FIG. 7. Namely, a pair of current electrodes 72 connected to a power source 77 is formed at respective end portions of the device and a pair of voltage electrodes 73 is formed inside of respective current electrodes 72. The pair of voltage electrodes 73 is connected to a potentiometer 78 for measuring a voltage caused between the pair of voltage electrodes 73 The application of current can induce a magnetic field in the superconductive material.

Conditions for producing the ceramic superconductive material give various influences to the superconductive magneto-resistive property thereof.

For example, the filling density of the ceramic superconductive material gives a great influence to the magneto-resistive property since it relates to formation of grain boundaries. The filling density can be changed by varying a press force for forming green pellets.

Also, the average diameter of micro particles in a ceramic powder to be sintered relates to the formation of grain boundaries.

Further, the roughness of the surface of the device has a great influence to on the magneto-resistive property thereof since it relates to the penetration depth of the magnetic field applied thereto. In this context, the thickness of the device also relates to the penetration depth of the magnetic field.

For example, when the filling density is reduced lower than 90% by reducing the press force to 0.5 ton/cm$^2$ and the roughness of surface of the device is increased more than 1 $\mu$m, the sensitivity to the magnetic field is observed to increase considerably. It is also increased by increasing continuous polosities formed therein while decreasing the filling density lower than 85% or by forming micro polosities therein with use of laser beam.

Figure 8:
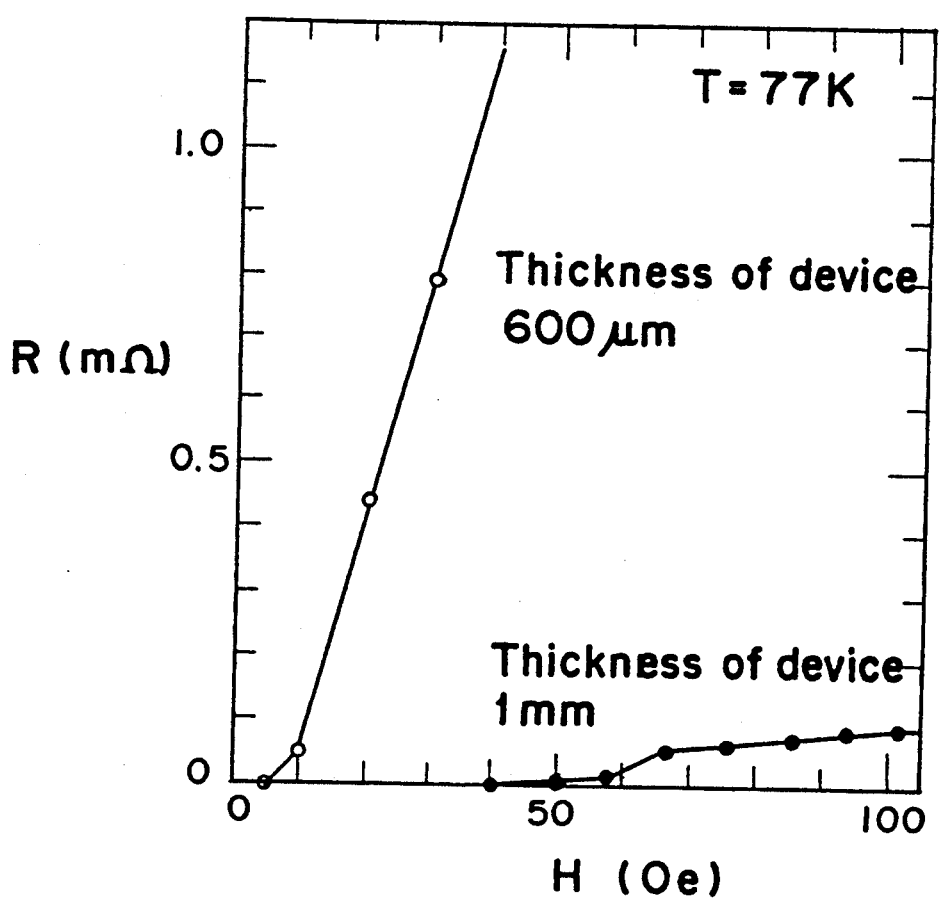
FIG. 8 is a graph showing the magneto-resistive property obtained by varying the thickness of the device according to the second preferred embodiment of the present invention.

FIG. 8 shows the dependency of the sensitivity on the thickness of device which is measured at 77 K. As shown clearly therein, the device formed to have the thickness of 600 $\mu$m shows an excellent sensitivity when compared with that of the device of 1 mm thickness. These devices are formed by cutting the disk-like pellet produced under the same conditions as those mentioned above.

Figure 9:
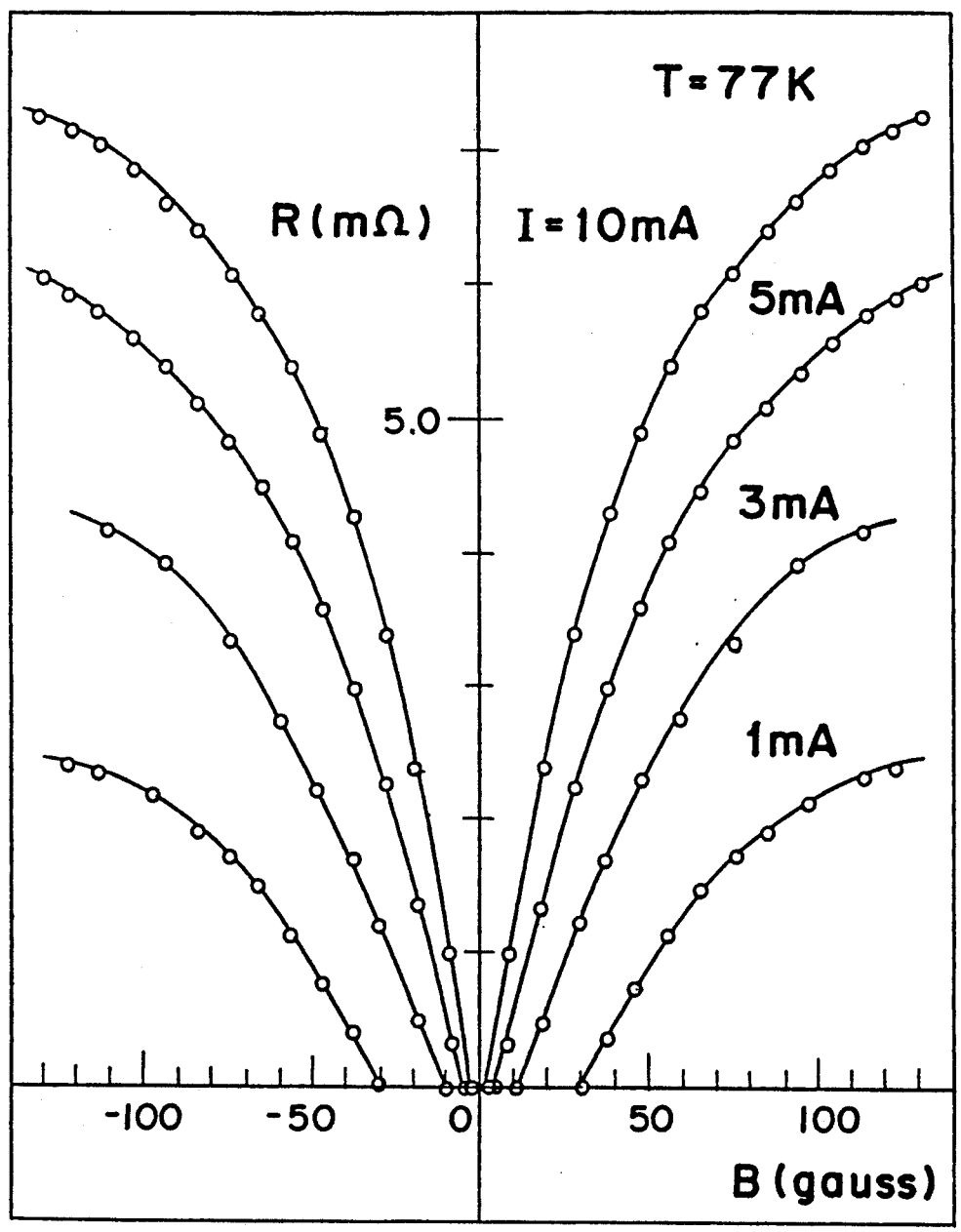
FIG. 9 is a graph showing the magneto-resistive property obtained by varying the current to be applied to the device shown in FIG. 7.

FIG. 9 shows the magneto-resistive property measured at 77 K when the grading of a ceramic powder to be sintered is increased up to 2 to 5 $\mu$m while keeping other production conditions the same as those mentioned above.

As is clear from comparison of FIG. 9 with FIG. 6, the sensitivity to the magnetic field is amazingly increased.

Further, the dependency on the current applied to the device is greatly improved. This suggests that the sensitivity to the magnetic field can be controlled by varying the current to be applied thereto.

Figure 10:
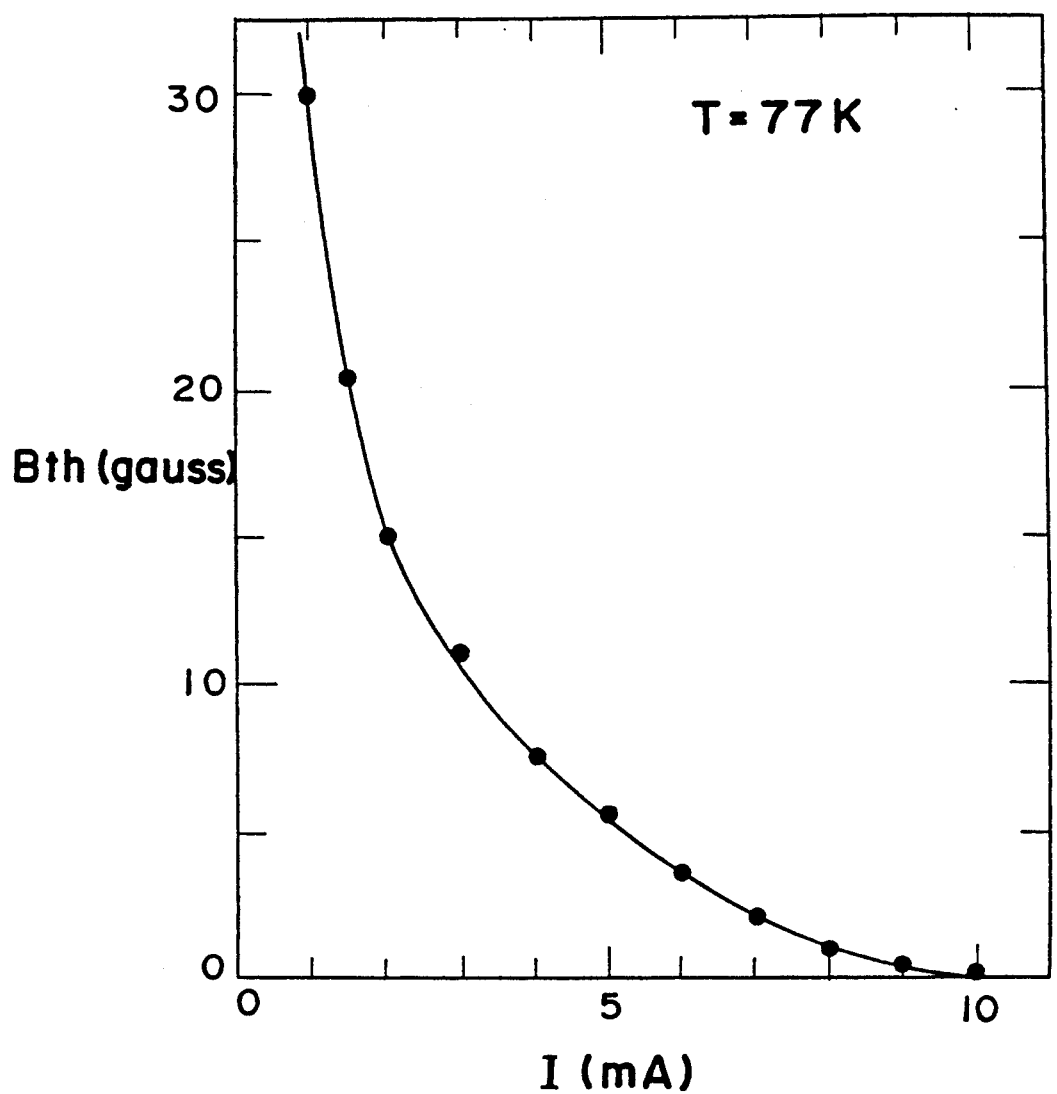
FIG. 10 is a graph showing the dependency of the threshold magnetic flux density Bth on the strength of current applied to the device shown in FIG. 6.

FIG. 10 shows the dependency of the threshold magnetic flux density Bth on the applied current. Bth is defined as a threshold value from which the resistance appears. Bth is 30 gauss at 1 mA, 5.5 gauss at 5 mA and is reduced to 0.2 gauss at 10 mA.

The reasons why such a great difference is caused between two devices are considered as follows. Since the grading of the starting ceramic material is different from each other though other conditions are same, coupling states among superconductive grains, namely, weak couplings are formed differently from each other.

Weak couplings formed in the latter device having a larger grading are considered to be more sensitive to the magnetic field than those of the former device.

As is apparent from the above, it is rather difficult to obtain devices having a uniform magneto-resistive property since it is very.

Figure 11:
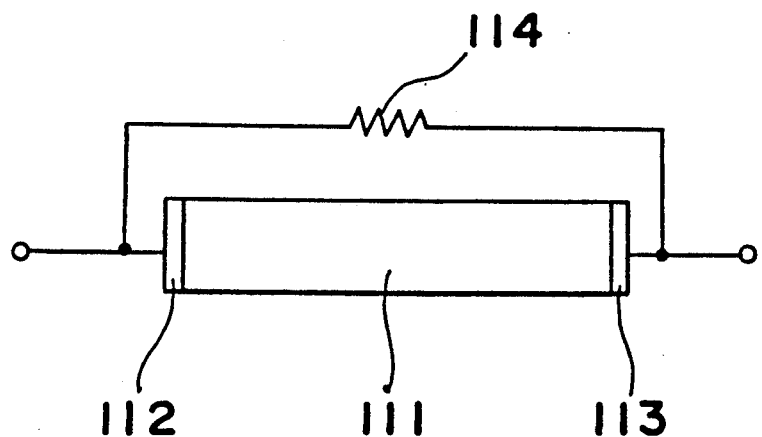
FIG. 11 is a schematic plan view of a variation of the first or second preferred embodiment for adjusting the magneto-resistive property of the device.

FIG. 11 shows a resolution for adjusting or regulating the magneto-resistive property of the device.

Figure 12:
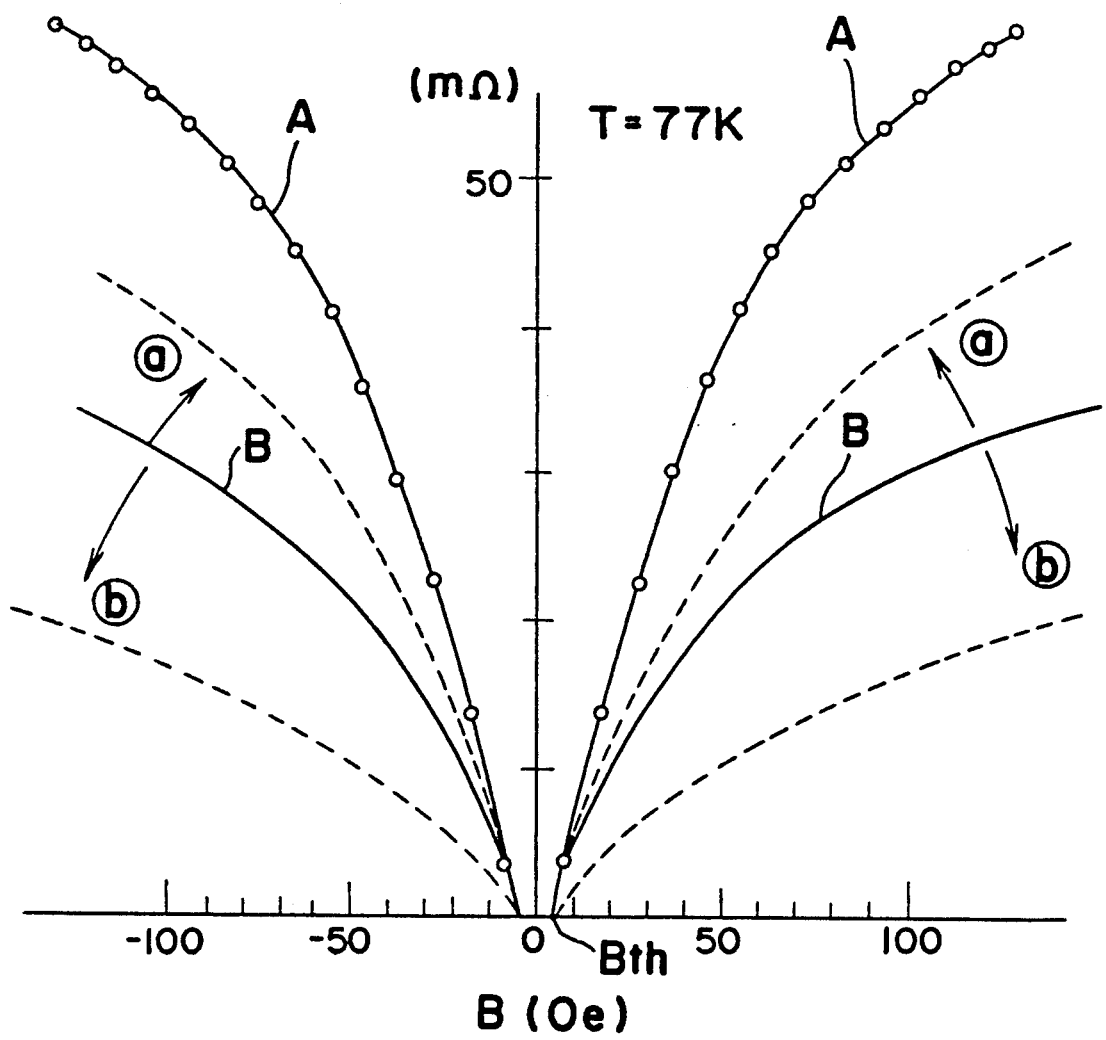
FIG. 12 is a graph showing the change in the magneto-resistive property obtained by varying the value of resistance connected parallel to the device in the variation shown in FIG. 11.

In this preferred embodiment, a resistance 114 is connected parallel to the device 111 having two electrodes and 113. If the device has a magneto-resistive property, as indicated by a characteristic curve A in FIG. 12, it is varied to a characteristic curve B by connecting a resistance 114 of, for instance, 50 m$\Omega$ parallel to the device 111. If the value of the resistance 114 is chosen at a value smaller than 50 m$\Omega$, the characteristic curve B is shifted in a direction indicated by an arrow b . Also, it is shifted in a direction indicated by an arrow a when the value of the resistance is chosen at a value larger than 50 m$\Omega$.

Thus, the characteristic curve of the device can be adjusted or controlled by choosing a suitable value of the resistance 114.

It is to be noted that the threshold Bth of magnetic flux density is not varied by the resistance 114. The resistance 114 can be connected between either one pair of current electrodes 72 and voltage electrodes 73 of the device 71 shown in FIG. 7.

Figure 13:
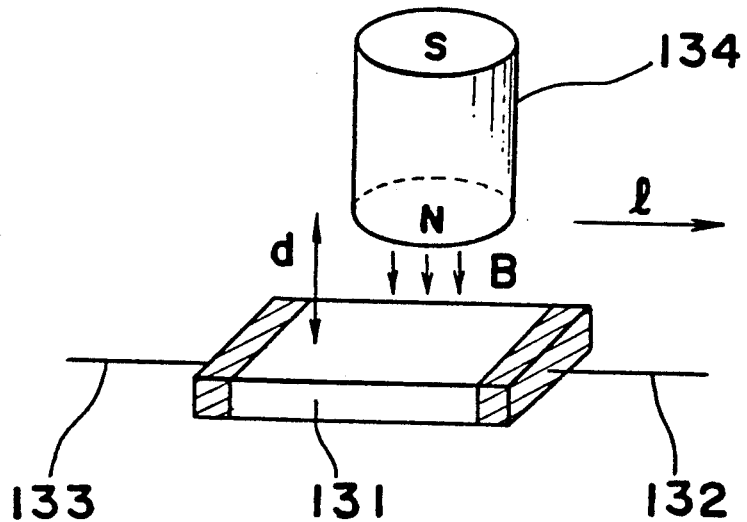
FIG. 13 is a schematic perspective view of a position sensor as the fourth preferred embodiment of the present invention.

FIG. 13 shows an application of the device as a displacement sensor. Also, it is possible to restrict the circuit current at a constant value using a resistance connected to the device 111 in series even when the resistance of the device 111 is zero. Further, it is possible to adjust the characteristic curve by connecting resistances to the device 111 in parallel and in series, respectively.

In this preferred embodiment, a permanent magnet 134 is provided as means for applying an magnetic field to the device 131 having two terminals 132 and 133. When the magnet 134 is moved relative to the device 131 kept at 77 K in a vertical or a horizontal direction as indicated by an arrow d or l, the magnetic density flux B applied to the device 131 is varied according to the relative movement thereof. Therefore, it is possible to detect a relative position of the magnet 134 by measuring a variation of the resistance of the device 131.

Figure 14:
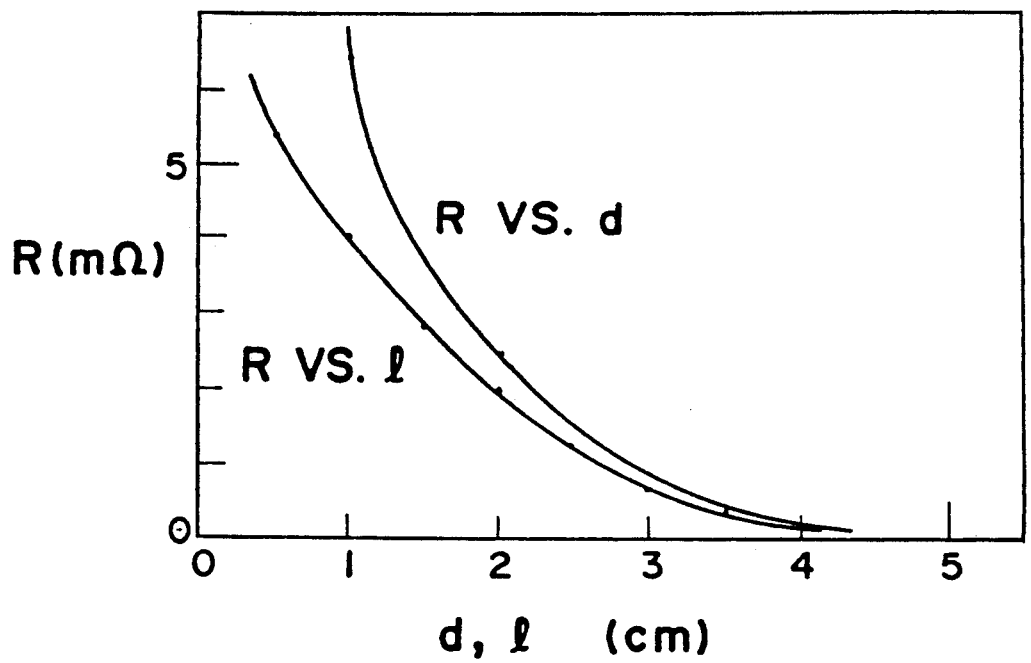
FIG. 14 is a graph showing changes in the resistance of the device measured by varying the distance d in the vertical direction and the position l in the horizontal direction in the first preferred embodiment of the present invention.

FIG. 14 shows variation curves of the resistance in the vertical and horizontal directions d and l.

Figure 15:
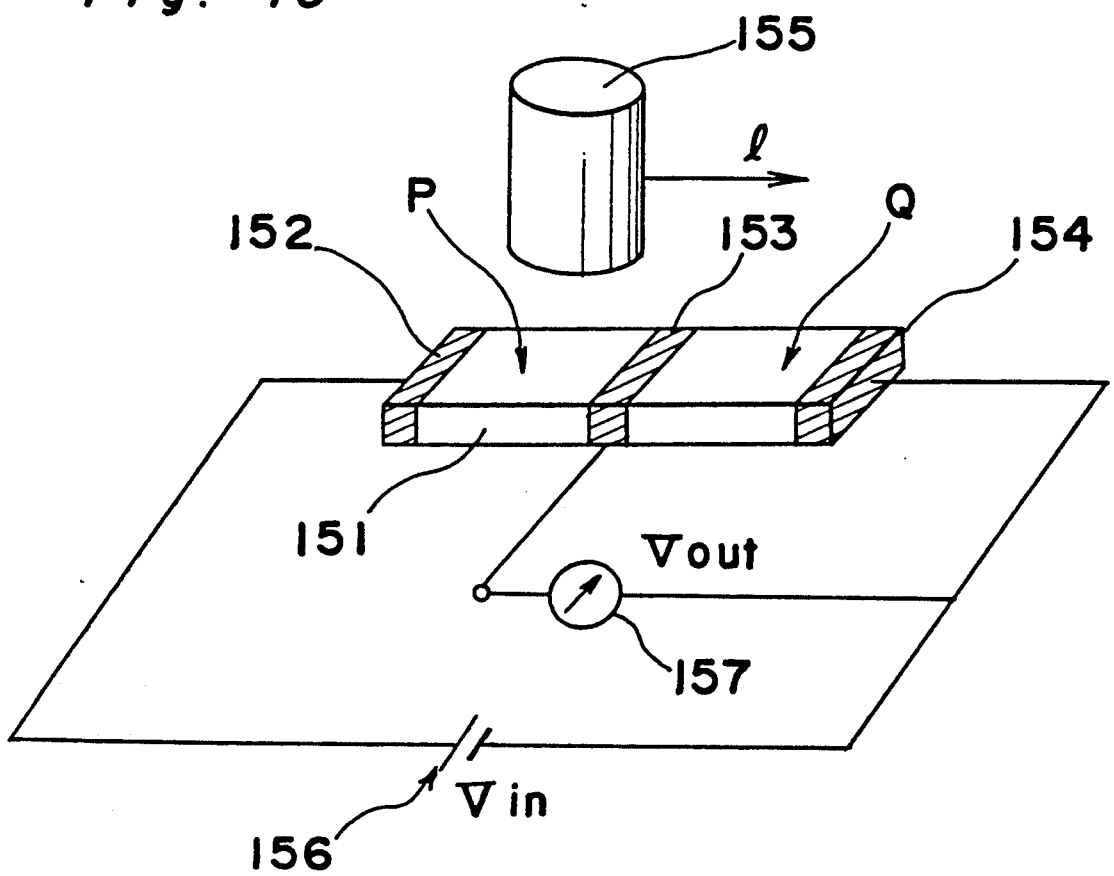
FIG. 15 is a schematic perspective view of another one dimensional position sensor according to the present invention.

FIG. 15 shows a potentiometer utilizing the device 151 having three terminals 152, 153 and 154.

Between two current terminals 152 and 154, a power source 156 such as a battery is connected and a potentiometer 157 is connected between the center terminal 153 and one current terminal 154 in order to measure a voltage generated therebetween.

If a permanent magnet 155 is placed above the portion P of the device 151, defined between the left current is electrode 152 and the center terminal 153, a resistance $R_{23}$ is generated along the portion P due to the magnetic field applied thereto by the magnet 155. However, no resistance is generated along the portion Q defined between the center terminal 153 and the right current terminal 154 since the magnetic field applied thereto is too weak to break the weak couplings in the portion Q. Therefore, an output voltage Vout between the terminals 153 and 154 is zero.

When the magnet 155 is moved so as to locate above the center terminal 153, the magnetic field is applied evenly to both of the portions P and Q and, therefore, the superconductive phase in each half portion of respective portions P and Q is broken and even resistances $R_{23}$ and $R_{34}$ are generated in respective portions P and Q. Accordingly, the output voltage Vout between two terminals 153 and 154 becomes equal to one half of the input voltage Vin applied between the terminals 152 and 154.

Further, when the magnet 155 is moved to a position above the portion Q, $R_{23}$ becomes zero while $R_{34}$ has a certain value. In this state, Vout becomes equal to Vin.

As is apparent from the above, the output voltage Vout varies proportional to an amount l of displacement of the magnet 155 when it is moved parallel to the lengthwise direction of the device 151. This relation is shown by a line a in FIG. 16. Thus, a non-contact potentiometer with a linear property can be obtained.

Figure 16:
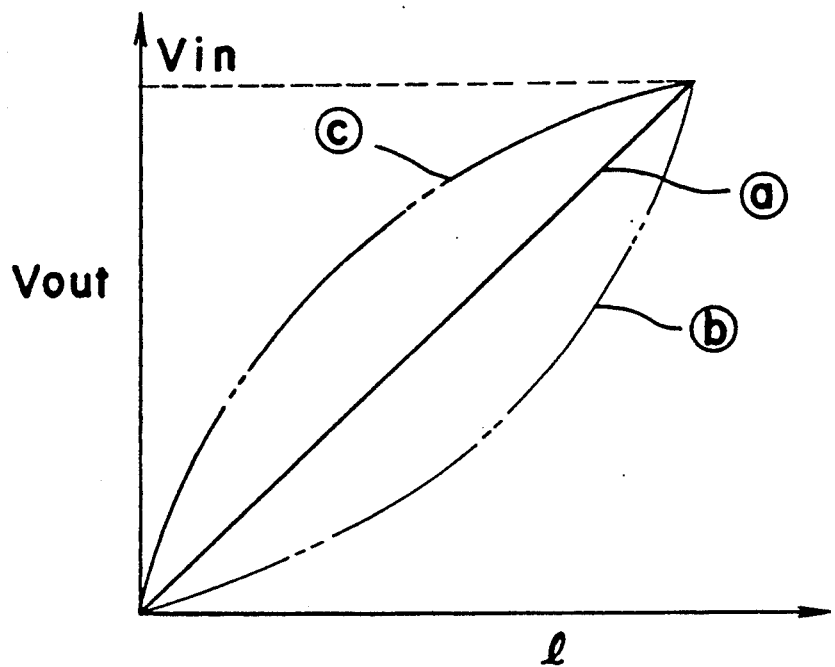
FIG. 16 is a graph showing a relation between the output voltage Vout and the position l in the horizontal direction.

If the cross section of the device is continuously varied along the lengthwise direction thereof, a logarithmic relation b or an expotential relation c may be obtained between the output voltage Vout and the displacement l as shown in FIG. 16.

The potentiometer of this type is noiseless and stable since the magnet 155 and the device 151 are not in contact with each other.

Figure 17:
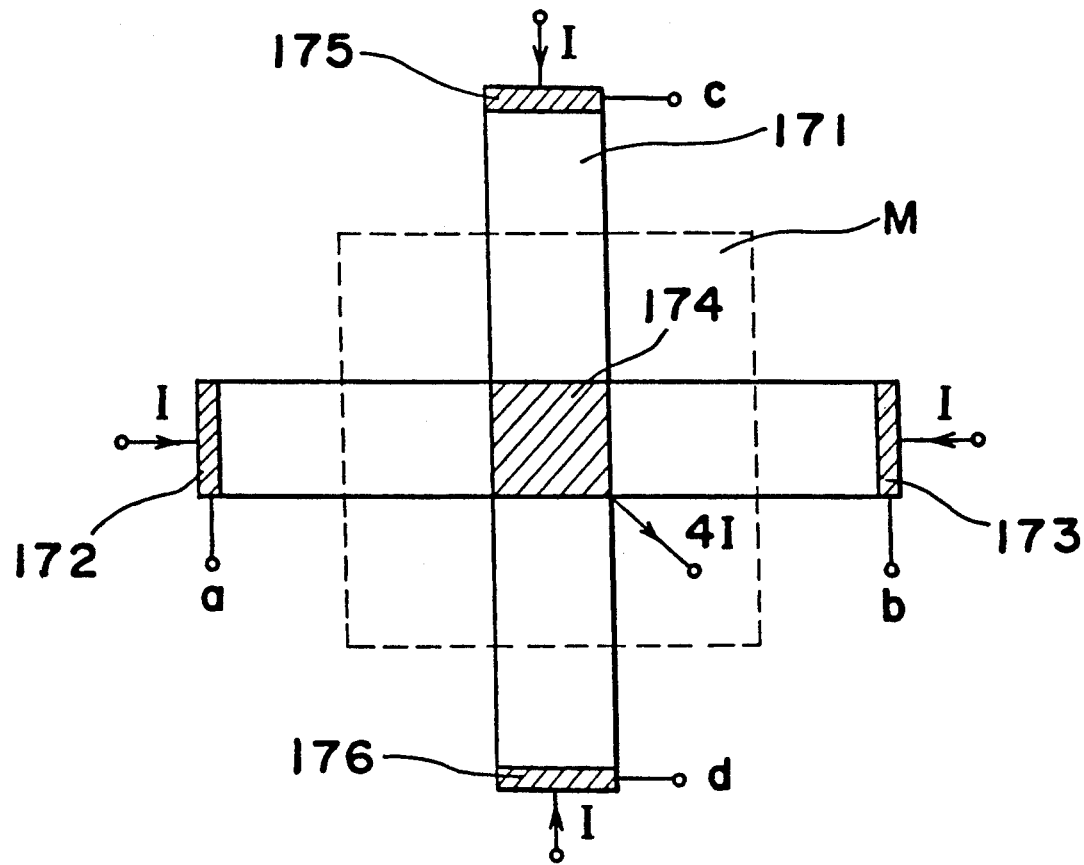
FIG. 17 is a schematic plan view showing a two dimensional position sensor as the fifth preferred embodiment of the present invention.

FIG. 17 shows an application of the principle of a non contact potentiometer to a two dimensional potentiometer.

In this embodiment, the device is formed to have a configuration of cross. Four end electrodes 172, 173, 175 and 176 are formed at respective free ends of four arms of the device 171 and one electrode 174 is formed at the center thereof. A predetermined constant current I is applied to each pair of end electrodes 172, 173 and 175, 176.

As indicated by a dotted square in FIG. 17, a magnetic field M having a square uniform flux density is applied to the device 171 kept at 77K.

Assuming that all of four arms have the same structure, no voltages are generated between two terminals 172 and 173 and between two terminals 175 and 176 if the center of the magnetic field M is located so as to coincide with that of the device 171.

However, if the magnetic field M is moved in the transverse direction without accompanying any movement in the longitudinal direction, a voltage Vab proportional to the displacement is generated between two terminals 172 and 173. But no voltage is generated between two terminals 175 and 176.

Similarly, if the magnetic field M is moved in the longitudinal direction without accompanying any movement in the transverse direction, a voltage Vcd is generated between two terminals 175 and 176 while no voltage is generated between other two terminals 172 and 173. If the center of the magnetic field M locates at an arbitrary position, voltage Vab and Vcd have respective values proportional to respective displacements in the transverse and longitudinal direction. Namely, the two dimensional potensiometer of non-contact type is obtained.

Generally speaking, all of arms need not have the same structure and all of currents to be applied to respective terminals need not have the same value.

In such a case, a position of the magnetic field M at which no voltage Vab and Vcd are generated is sought as the standard or neutral position of the potentiometer.

Figure 18:
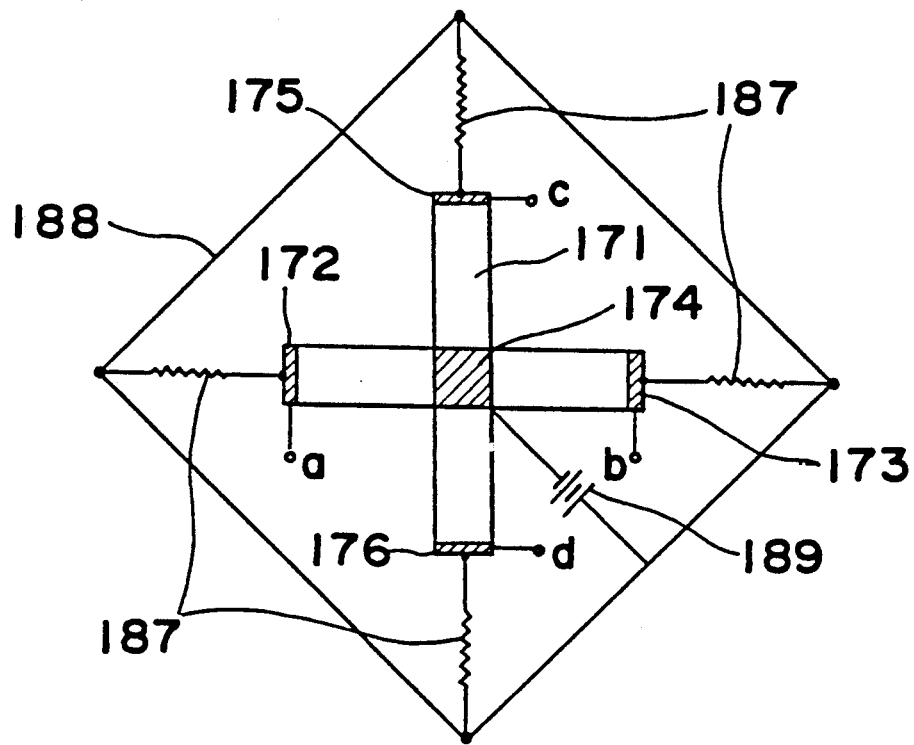
FIG. 18 is a schematic plan view of a circuit desirable for the two dimensional position sensor shown in FIG. 17.

FIG. 18 shows an example of circuit desirable for a practical use of the two dimensional potentiometer mentioned in FIG. 17.

As shown in FIG. 18, each of four end terminals 172, 173, 175 and 176 is connected, via a resistance 187 having a high value, to a common line 188 and, between the center electrode (terminal) 174 and the common line 188, a power source 189 having a constant voltage is connected.

The potentiometer of cross configuration can be formed with use of four devices as shown in FIG. 5. In this case, they are arranged to form a cross and respective one end of them is electrically connected to each other by a suitable connecting means for forming a center electrode.

Figures 19A, 19B:
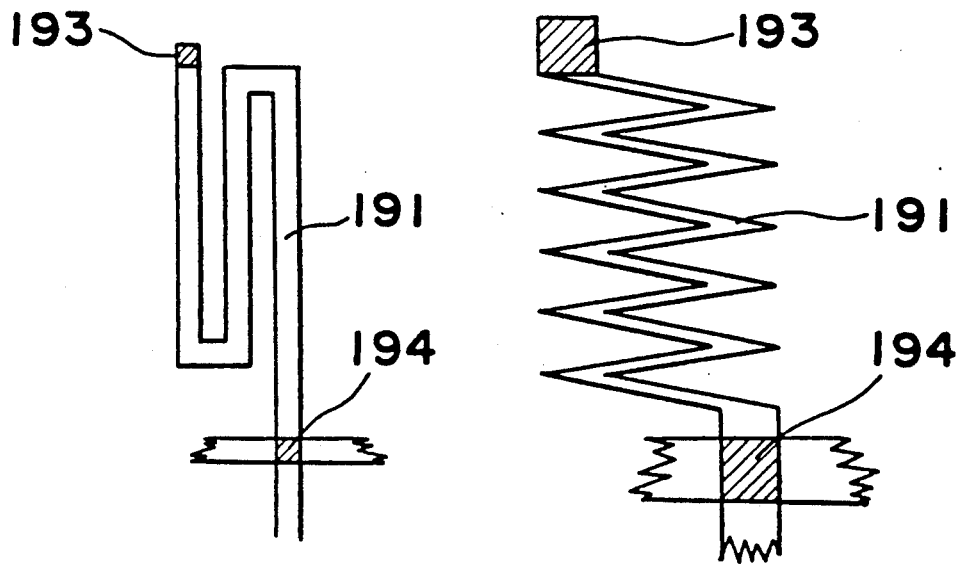
FIGS. 19(a) and 19(b) are examples of the device intended to increase the resistance of unit length, respectively.

As shown in FIGS. 19(a) and 19(b), each arm 191 between two electrodes 193 and 194 can be formed as a folded line in order to increase the resistance of unit length.

Figure 20:
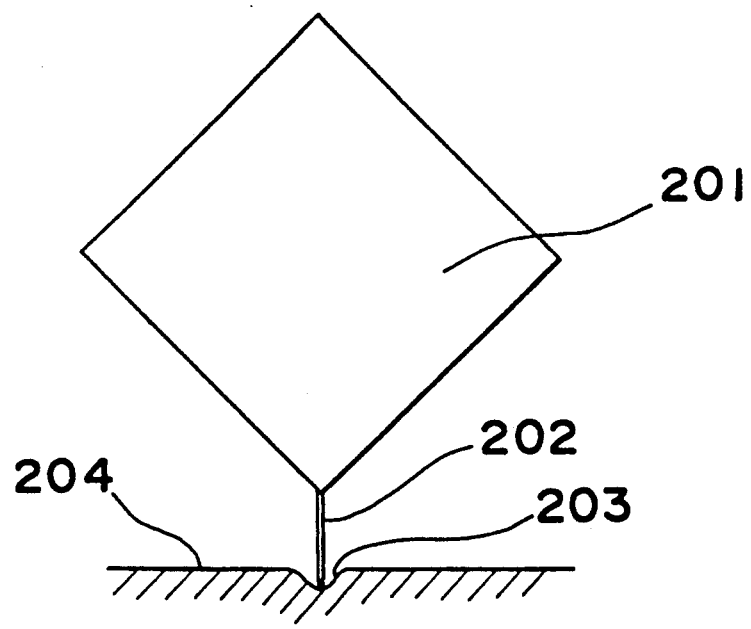
FIG. 20 shows an application of the two dimensional position sensor to a pick up head for a record player.

FIG. 20 shows an application of the two dimensional potentiometer to a pick up head for a record player.

In this case, a needle 202 is fixed to the two dimensional potentiometer 201 so as to contact a groove 203 of a record 204. When the needle 202 is shifted by the guide of the groove, two dimensional displacement of the potentiometer 201 relative to a constant magnetic field applied thereto is detected in order to obtain information about sounds.

Figure 21:
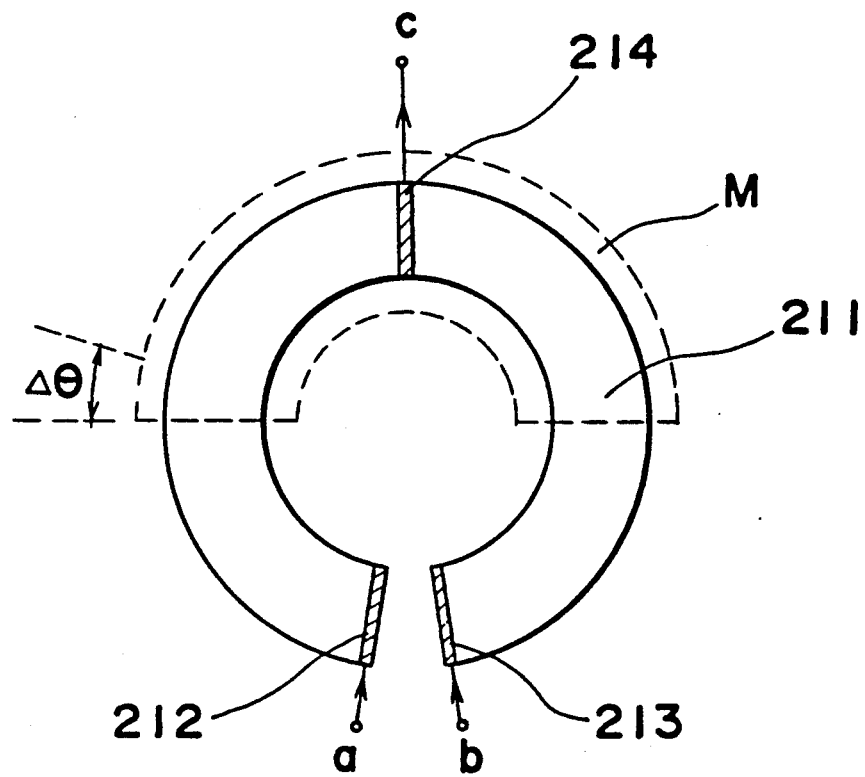
FIG. 21 is a schematic plan view showing a potentiometer for detecting a rotational displacement as a variation of the two dimensional position sensor.

FIG. 21 shows an application to a potentiometer for detecting a rotational displacement.

In this embodiment, a device 211 is formed to have a configuration of ring cut off in a radial direction at a position. At each free end of the device 211 and at a symmetric position with respect to both free ends, electrodes 212, 213 and 214 are formed. A constant current I is applied to each of the free end electrodes 212 and 213.

As indicated by a dotted line in FIG. 21, a magnetic field M having a half circular cross section which is cocentric with the device 211 kept at 77 K is applied to the latter. If the magnetic field M is applied symmetric with respect to the center electrode 214, the voltage Vac generated between two electrodes 212 and 214 is equal to the voltage Vbc generated between two electrodes 213 and 214. However, if the magnetic field M is rotated by $\Delta\theta$ around the center axis of the device 211, the balance between Vac and Vbc is broken to generate a voltage between two free end electrodes 212 and 213 proportional to $\Delta\theta$.

FIGS. 22(a), 22(b), 23(a) and 23(b) show another example of a potentiometer for detecting a rotational displacement.

Figure 22A:
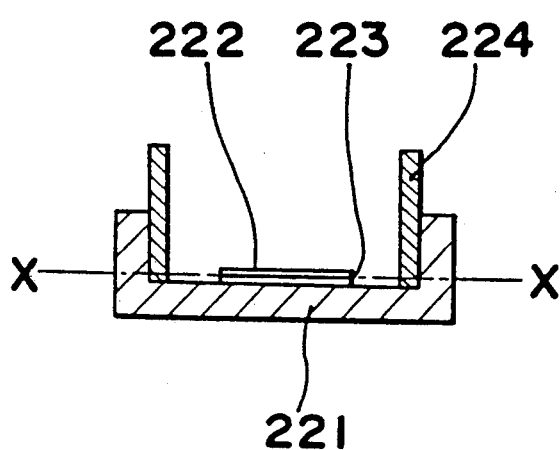
Figure 23A:
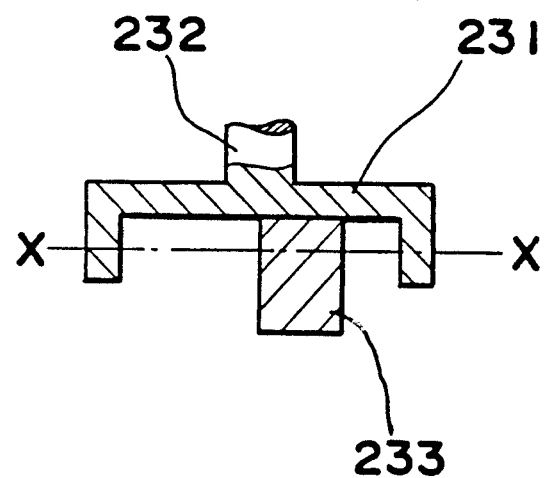
Figure 22B:
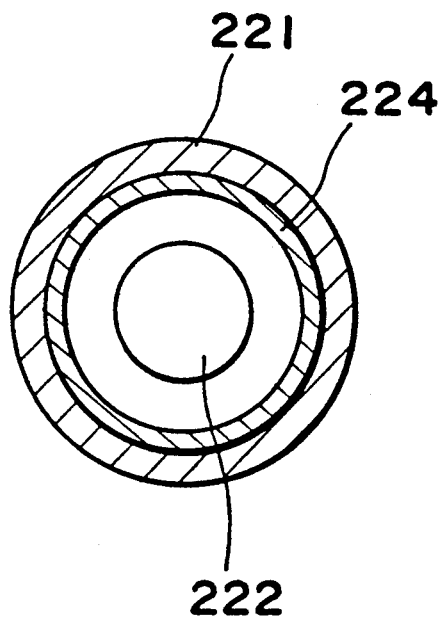
Figure 23B:
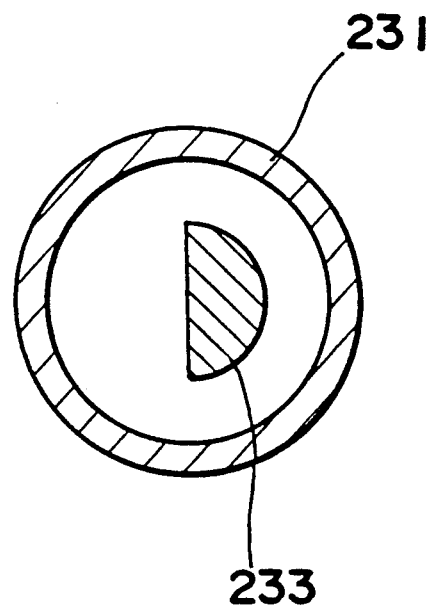

This potentiometer is comprised of a bottom member 221 and a cap member 231. The bottom member 221 is made of magnetic material and is of a disk-like configuration, as shown in FIGS. 22(a) and 22(b). At the center portion of the bottom thereof, a circular superconductive device 222 is fixed by an insulation element 223.

The cap member 231 made of a magnetic material is formed to define a closed space between the bottom member 221 and is guided by a guide ring 224 of the bottom member 224 to rotate around the center axis 232 thereof. A permanent magnet 233 having a half circular cross-section is fixed inside thereof so as to oppose to the device 222 with a small gap.

When the cap member 231 is rotated relative to the bottom member 221, the relative phase of the magnet 233 to the device 222 is varied. Accordingly, a potentiometer is realized by detecting the relative phase of the magnet 233. In this potentiometer, the magnetic flux density is maintained permanently since there is not any factor which decreases the magnetic flux density.

Figure 24:
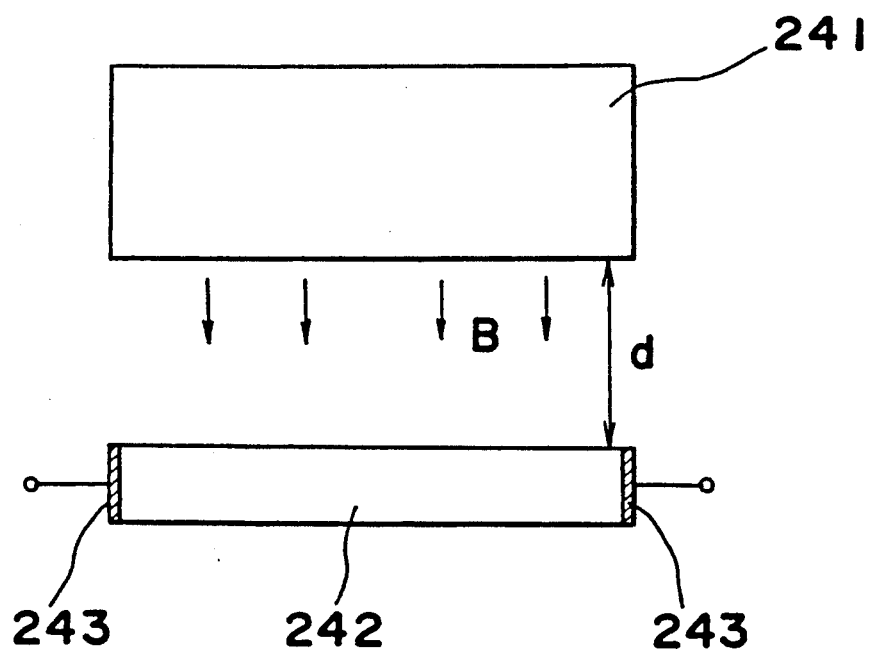
FIG. 24, is a schematic front view showing an application of the device to a variable resistance or a displacement transformer.

FIG. 24 shows an application of the device as a variable resistance or a displacement transformer.

Figure 25:
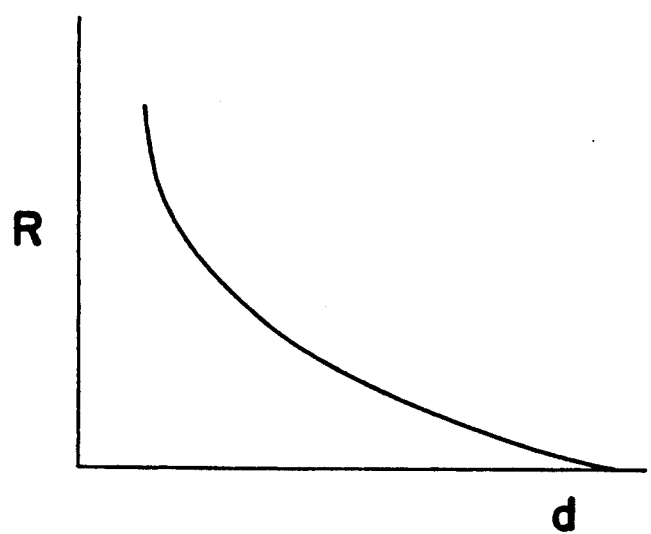
FIG. 25 is a graph showing a relation between the resistance of the device and the distance d from the manget to the device in FIG. 24.

In this example, a permanent magnet 241 is displaced relative to an elongated superconductive device 242 having two terminals 243 in the vertical direction while applying a homogeneous magnetic field to the device 242 along the whole length thereof. When the distance d between the magnet 241 and the device becomes to a certain value, a resistance appears in the device 242 and increases as the magnet 241 approaches to the device. This relation is shown in FIG. 25. This relation can be utilized as a variable resistance or a displacement converter which outputs a voltage between two terminals 243 in accordance with the distance d.

Figure 26:
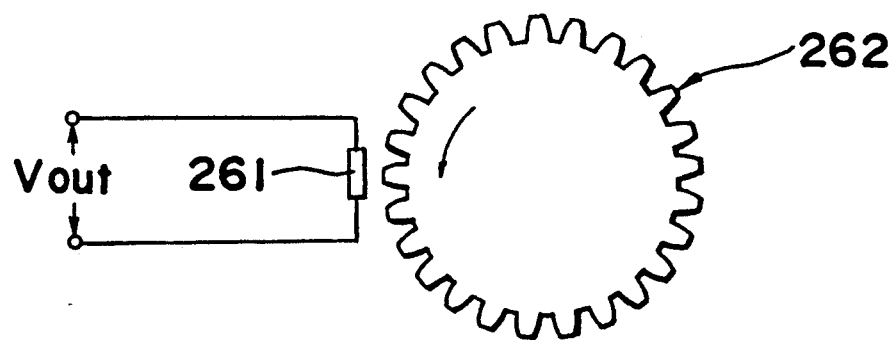
FIG. 26 is a schematic plan view showing an application of the device to a rotary encoder.

FIG. 26 shows an application to a rotary encoder. A superconductive device 261 is arranged near to a flat gear 262 which is magnetized permanently. When the gear 262 is rotated around the center axis thereof together with a rotating body (not shown), the magnetic field applied to the device 261 is varied periodically in accordance with a pitch of tooth of the gear 262. Namely, when the top of each tooth approaches to the device 261, the magnetic field is increased while it is decreased when the bottom of each tooth approaches thereto.

Figure 27:
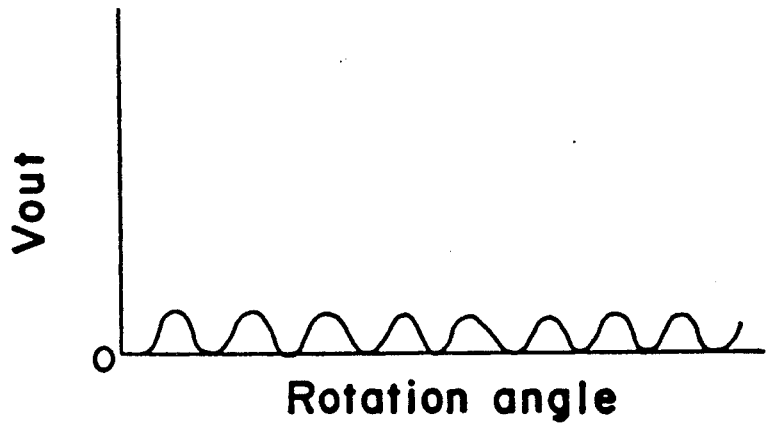
FIG. 27 shows an output voltage Vout obtained according to the rotation of the gear 262 shown in FIG. 26.

Accordingly, an output voltage Vout generated between two terminals of the device 261 is varied periodically as shown in FIG. 27. Thus, the rotation angle of the gear 262 can be measured by counting a number of pulses obtained from the output voltage Vout.

Further, it is possible to apply this system to a detecting system for detecting a rotational angular velocity by counting the number of pulses for a predetermined time interval.

If the gear is replaced by a rack (not shown) which moves parallel to the device 261, displacement or velocity of a linear motion can be detected by counting a number of pulses outputted as Vout.

Figure 28:
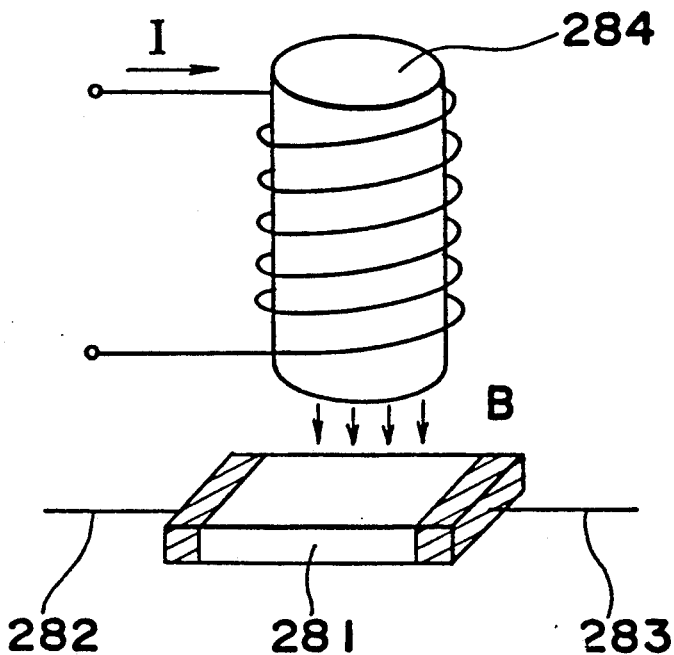
FIG. 28 is a schematic perspective view showing the sixth preferred embodiment of the present invention which provides means for applying a variable magnetic field to the device.

FIG. 28 shows an example utilizing an electromagnet as means for applying a magnetic field to a superconductive device.

In this case, the electromagnet 284 is arranged opposed to the device 281 having two terminals 282 and 283. When a current I is applied to the electromagnet 284, a resistance appears in the device 281 kept at 77 K if the magnetic field generated thereby has a strength enough for causing the resistance.

Accordingly, this system can be applied to an electromagnetic relay by connecting it to a load and a power source serially or connecting it to a control terminal of a device having a high input impedance such as a MOS transistor.

Figure 29:
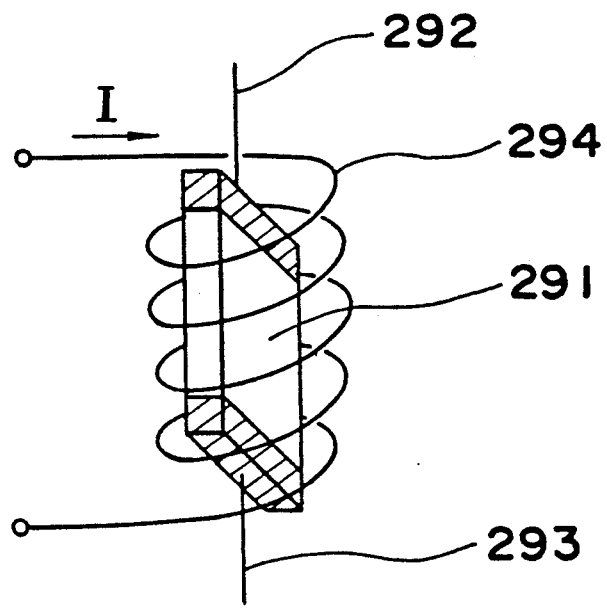
FIG. 29 is a schematic perspective view showing an electro-magnetic relay as a variation of the sixth preferred embodiment of the present invention.

As shown in FIG. 29, it is also possible to constitute an electro-magnetic relay by inserting a superconductive device 291 having two terminals 292 and 293 in a solenoid 294.

Figure 30:
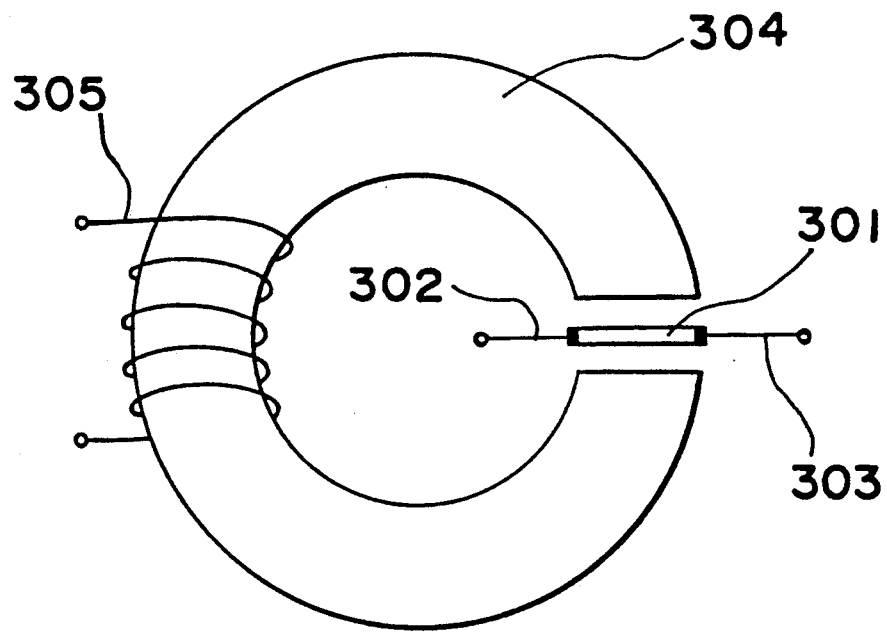
FIG. 30 is a schematic front view showing another electro-magnetic relay as another variation of the sixth preferred embodiment.

Further, as shown in FIG. 30, such an electro-magnetic relay can be constituted by arranging a device 301 having two terminals 302 and 303 in a gap of an electromagnet 304 of a doughnut-like configuration. When a current is supplied to a solenoid 305 of the electromagnet 304, a magnetic field is applied to the device 301 which causes a resistance in the device.

The electro-magnetic relay of this type can be operated with a high reliability since any mechanical vibration such as a chattering proper to a conventional one is not caused and it is free from imperfect contact due to dusts or oxidization of contacts. Further, it is advantageous in that it never generates noises or mechanical sounds.

It is also to be noted, that the resistance of the device can be varied by controlling the current applied to the electromagnet. This suggests an applicability to a variable resistor of non contact type.

The system shown in either one of FIGS. 28, 29 and 30 can be also applicable to a potentiometer or a displacement sensor of the non contact type.

Figure 31:
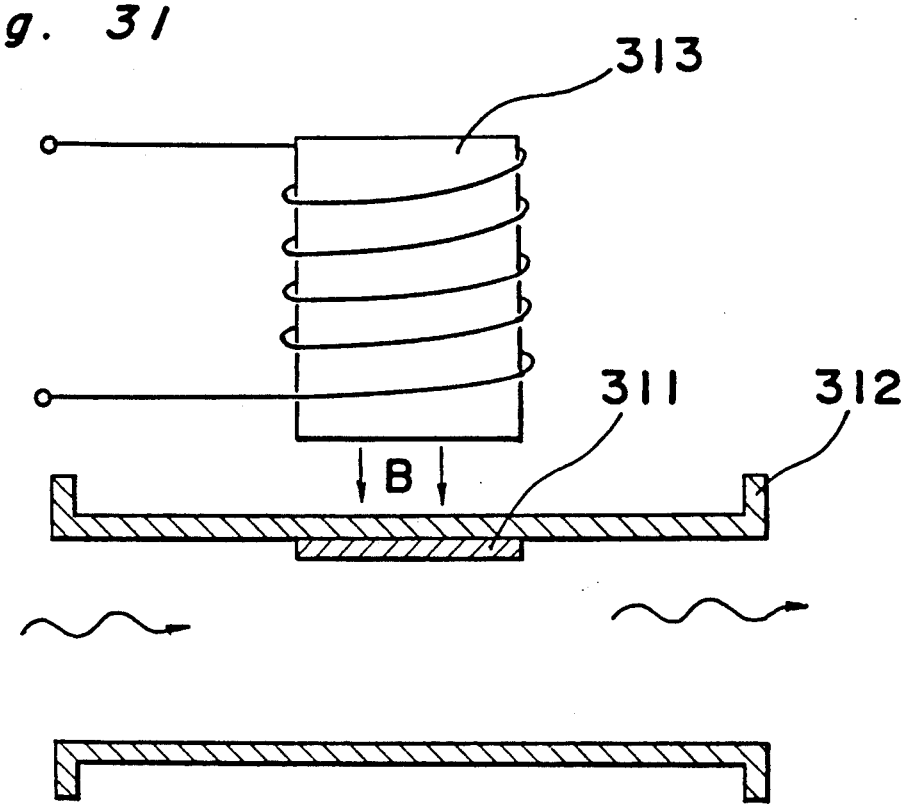
FIG. 31 is a schematic cross-sectional view showing the seventh preferred embodiment of the present invention as an application to a microwave guide.

FIG. 31 shows an example of application to a control system of microwave.

As shown therein, a superconductive device 311 is fixed onto an inside wall of a wave guide 312 and an electromagnet 313 is provided for applying a magnetic field B to the device 311 kept at 77 K from the outside of the wave guide 312.

In this system composition, input microwave is propagated in the wave guide 312 without any loss since any resistance is not generated when no current is applied to the solenoid of the electromagnet 313. However, when a current is supplied thereto, the device 311 has a resistance due to the magnetic field applied thereto. The microwave being propagated in the wave guide 312 is absorbed by the device 313 partially. Due to this, the intensity of the microwave is reduced.

Figure 32:
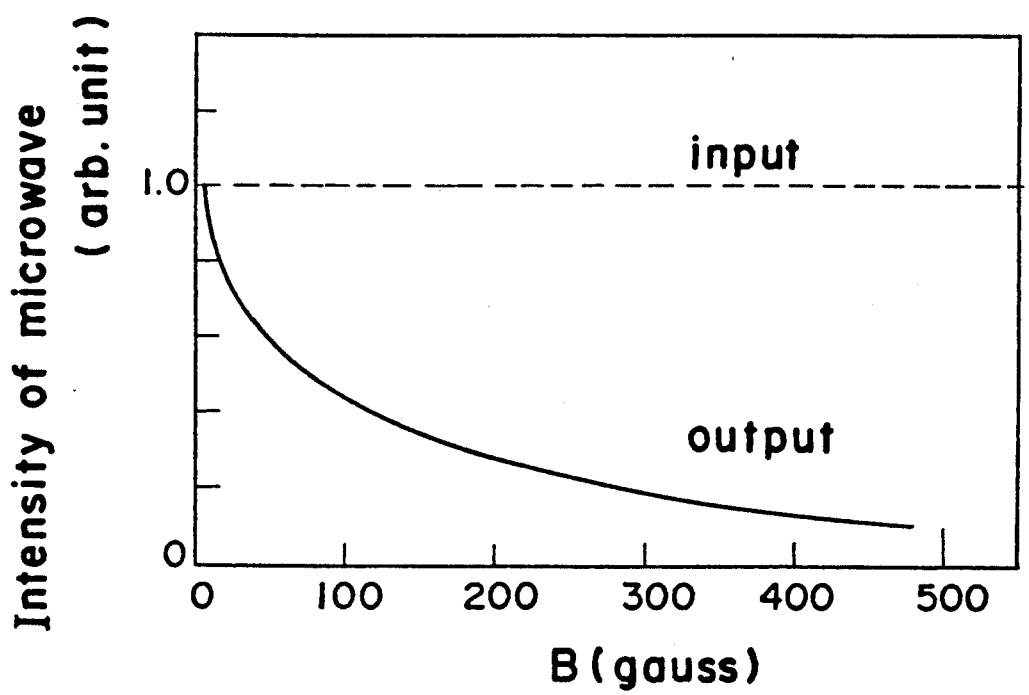
FIG. 32 is a graph showing a relation between the magnetic flux density and the intensity of microwave measured when the former is varied.

If the intensity of the magnetic field B is increased by increasing the current to be supplied to the electromagnet 311, the microwave is attenuated as shown schematically in FIG. 32.

Namely, the system shown in FIG. 31 constitutes a variable attenuator for microwave free from mechanical structures.

Figure 33A:
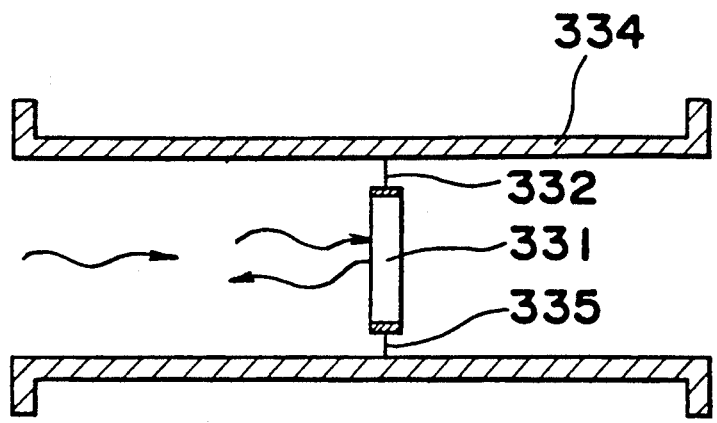
FIGS. 33(a) and 33(b) show another example of the application to the microwave guide.
Figure 33B:
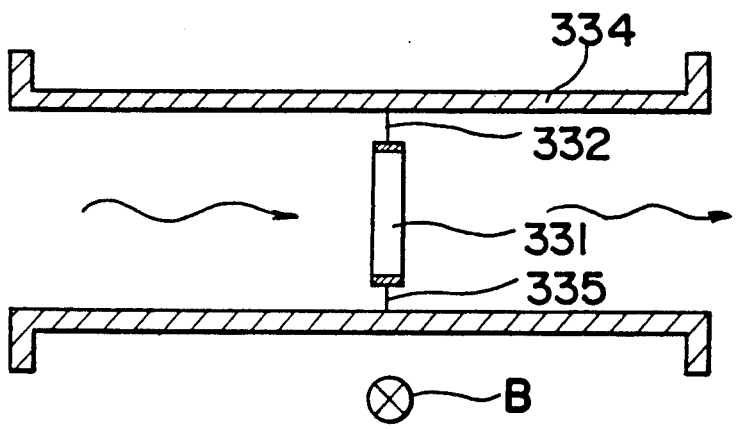

FIGS. 33(a) and 33(b) show another application of a superconductive device to the microwave system.

In this example, a superconductive device 331 having two terminals 332 and 333 is arranged in a wave guide 334 so as to be perpendicular to the axial direction of the wave guide 334. Each of terminals 332 and 333 is connected to the inner wall of the wave guide 334.

If no magnetic field is applied to the device 331, a microwave incident into the waveguide 334 is reflected by the device 331 since it is in the prefect anti-magnetic state, as shown in FIG. 33(a).

However, if a magnetic field B is applied to the device 331 as shown in FIG. 33(b), the device 331 becomes a resistive body in the wave guide 334. Accordingly, an incident microwave is propagated in the wave guide 334 and outputted from the exit thereof although it is absorbed partially by the device 331.

Thus, this system functions as a microwave switch. Further, it functions as a variable attenuator for microwave by varying the intensity of the magnetic field to be applied to the device.

Figure 34:
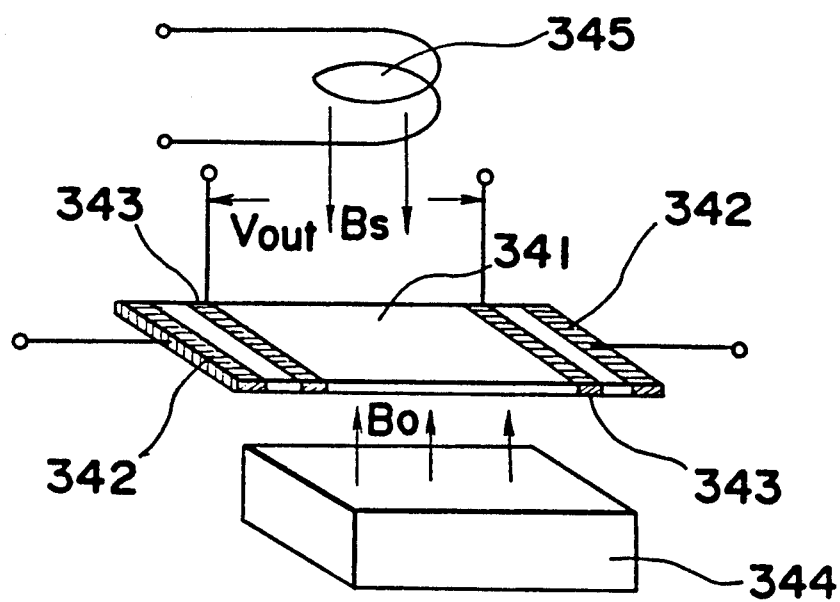
FIG. 34 is a schematic perspective view showing the seventh preferred embodiment of the present invention.

FIG. 34 shows a detection system for detecting a magnetic field with use of a superconductive device 341 having two current electrodes 342 and two voltage electrodes 343.

To this device 341, a permanent magnet 344 is provided for applying a magnetic field $B_0$ as a bias which has an intensity slightly larger than that necessary for breaking weak couplings in the device 341. When a weak magnetic field $B_s$ is applied to the device 341 from a source 345 of weak magnetic signal, an output voltage Vout generated between two voltage electrodes 343 is increased sensitively to the applied magnetic field $B_s$.

Figure 35:
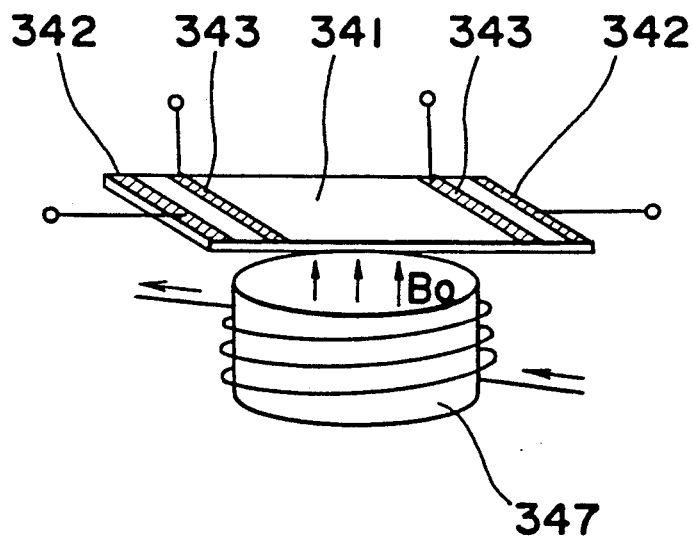
FIG. 35 is a schematic perspective view showing a variation of the seventh preferred embodiment of the present invention.

The permanent magnet 344 can be replaced by an electromagnet 347 as shown in FIG. 35. In this case, it becomes possible to control the bias magnetic field by adjusting a current to be applied to the electromagnet 347. Accordingly, it is always possible to set a suitable bias material field in accordance with the dimension and configuration of the device to be used.

This system may be applied to a reading head for reading a magnetic tape or to a processing head for processing an image signal or the like if a superconductive material which can operate at a room temperature is developed.

Figure 36:
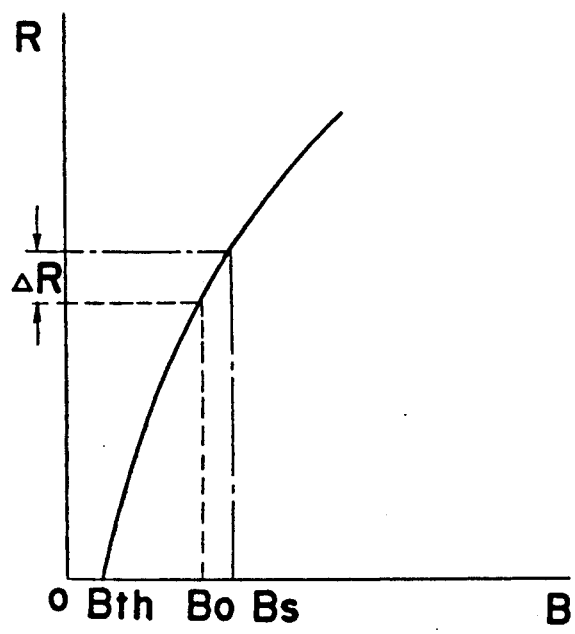
FIG. 36 is a graph showing the way for determining the strength of the biasing magnetic field in the composition shown in FIG. 35.

In the above embodiment, the bias magnetic field $B_0$ is chosen carefully in order to obtain a high sensitivity to a weak magnetic signal. Namely, it is chosen so as to utilize a steep variation in the resistance of a device, as shown in FIG. 36.

Figure 37:
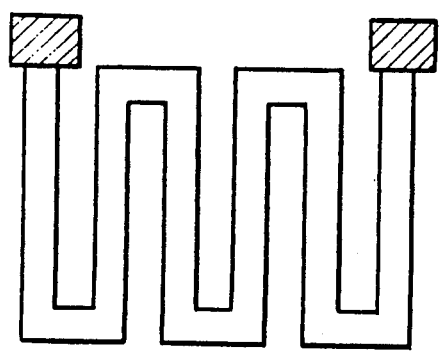
FIG. 37 is a plan view showing an example for increasing the resistance of unit length of the device.

In order to obtain a large variation in the output voltage Vout or the resistance, it is advantageous to form a superconductive portion of the device to a zig-zag configuration by the ion plating method or the laser irradiation, as shown in FIG. 37.

This enables the resistance to increase up to an order of 1 KΩ. In this example, the resistance varies by about 270 mΩ to a variation of 1 gauss in the magnetic signal and, therefore, the output voltage Vout varies by 27 mV to the current of 100 mA.

Figure 38:
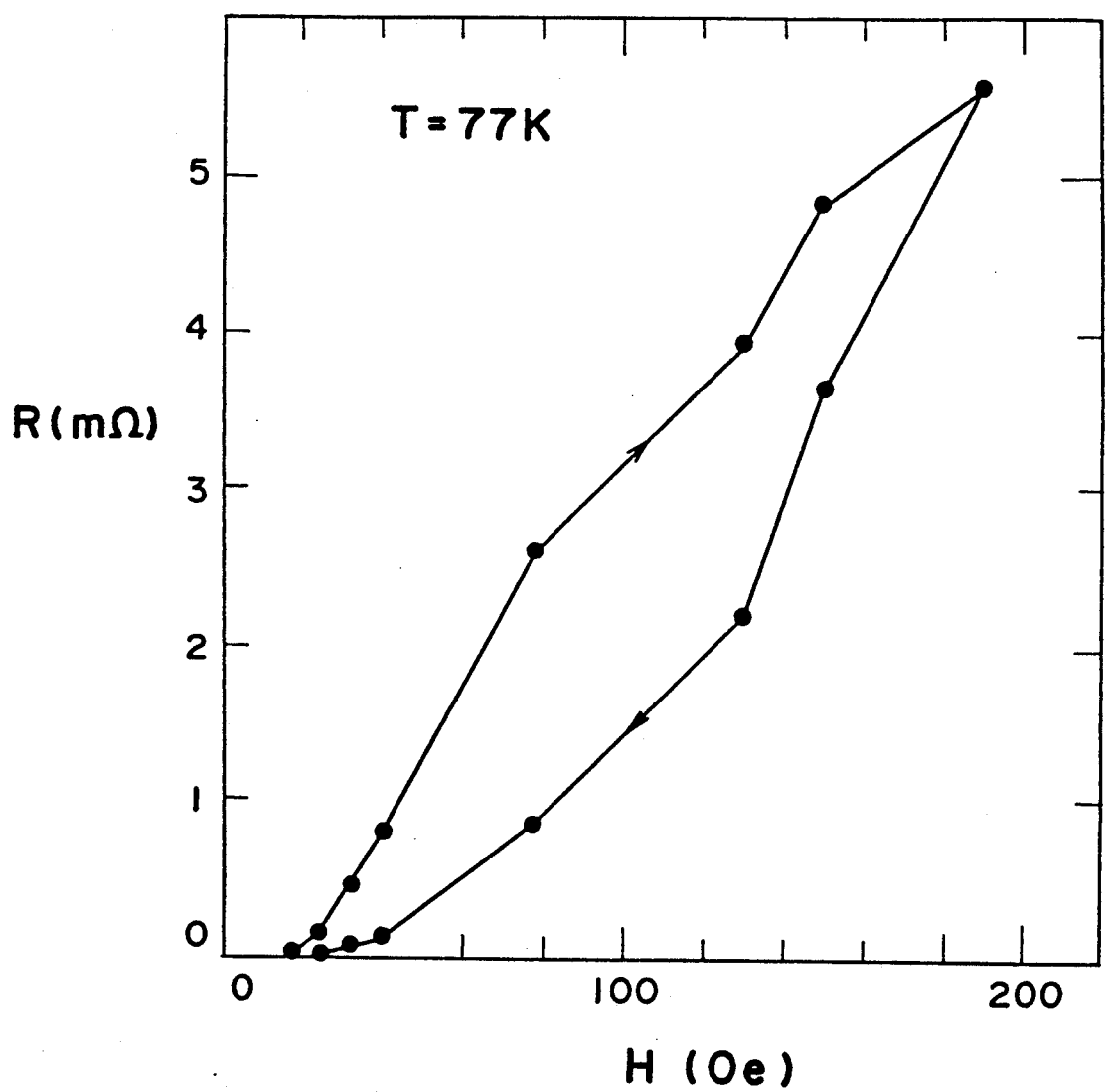
FIG. 38 is a graph showing the hysteresis in the magneto-resistive property of the device according to the present invention.

According to an experiment done by the present inventors, the device of this kind shows a hysteresis in the superconductive magneto-resistive property when measured by varying the magnetic field applied to the device while keeping the current applied thereto constant, as is shown in FIG. 38.

This hysteresis phenomena causes an error upon detection of a weak magnetic signal of an order of about several tens gauss.

This phenomena is considered as the result that weak couplings are maintained in the broken state when the magnetic field is reduced while keeping the current constant.

In order to avoid the hysteresis, which causes an error upon detecting a weak magnetic field, it is desirable to drive the device with use of a current which becomes zero once.

Figure 39:
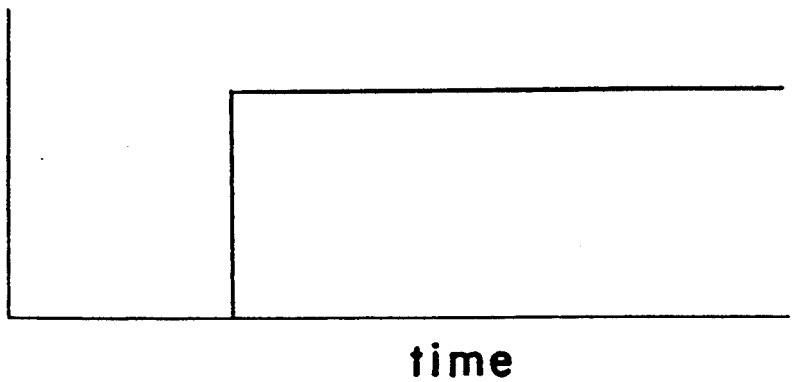
FIGS. 39(a), 39(b), 39(c) and 39(d) show various desirable waveforms of the current to be applied to the device.
Figure 39:
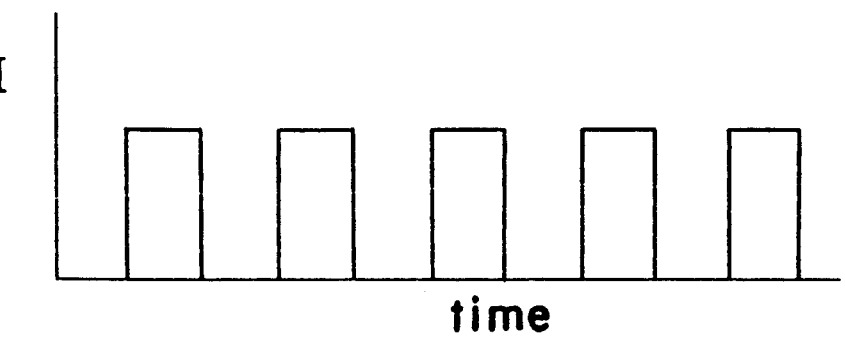
Figure 39:
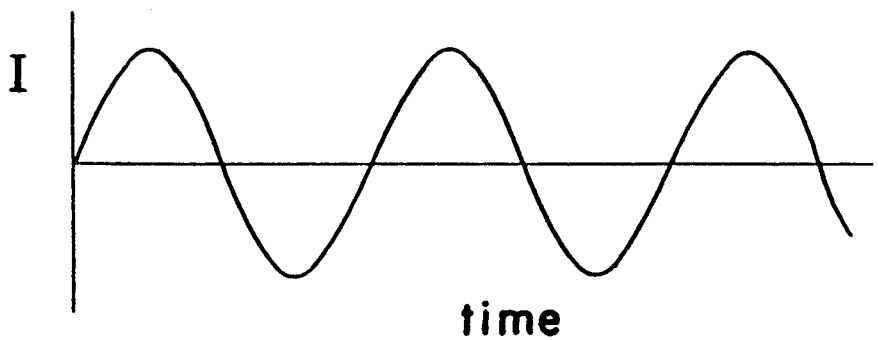
Figure 39:
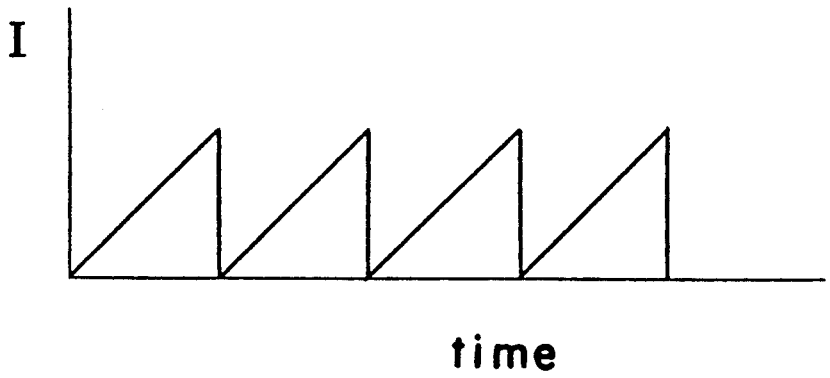

FIG. 39 shows examples of such a current to be applied to the device. Namely, in the example (a), the current is kept at zero for a while and then raised up to a predetermined level. In the example (b), square pulses are applied to the device. Also, in the examples (c) and (d), an alternating current and a saw tooth current are used to drive the device, respectively.

When the current to be applied to the device is reduced to zero, the device is resumed to the superconductive state thereof and, therefore, the hysteresis does not affect to the detection of a weak magnetic signal.

This driving method enhances the stability and credibility of the system according to the present invention.

Figure 40:
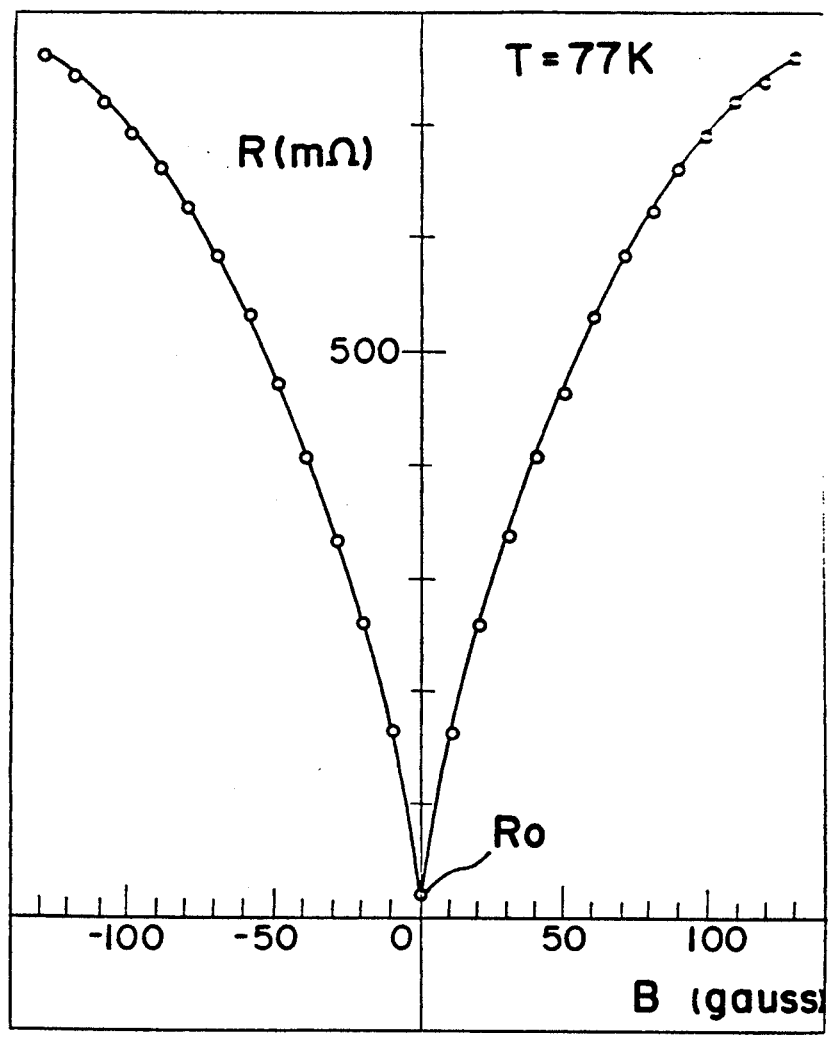
FIG. 40 is a graph showing the magneto-resistive property of another superconductor according to the present invention.

Although the superconductive material mentioned above shows the superconductivity at 77 K (temperature of the liquid nytrogen), a superconductive material having a magneto-resistive property which shows a small intrinsic resistance $R_0$ at 77 K, as shown in FIG. 40, can be used in the present invention as far as the resistance increases steeply as the magnetic flux density increases.

The superconductive material having the magneto-resistive property mentioned above is produced as follows.

Powders of $Y_2O_3$, $BaCO_3$ and $CuO$ are weighed at a predetermined ratio in order to obtain a superconductive material having a composition $Y_{1.2}Ba_{1.8}Cu_3O_{7-x}$. After grinding and mixing these powders, samples formed with the mixture are calcined at 900° C. for 5 hours in air. Then, the samples are crushed and ground into powder comprised of micro particles having a diameter equal to or smaller than 1 μm. Then, the powder is pressed into disk-like pellets of 1 mm thick with a press force of 1 ton/cm$^2$.

Finally, these pellets are sintered at 1000° C. for 3 hours in air and, then, the temperature is gradually lowered to 200° C. for 5 hours.

Figure 41:
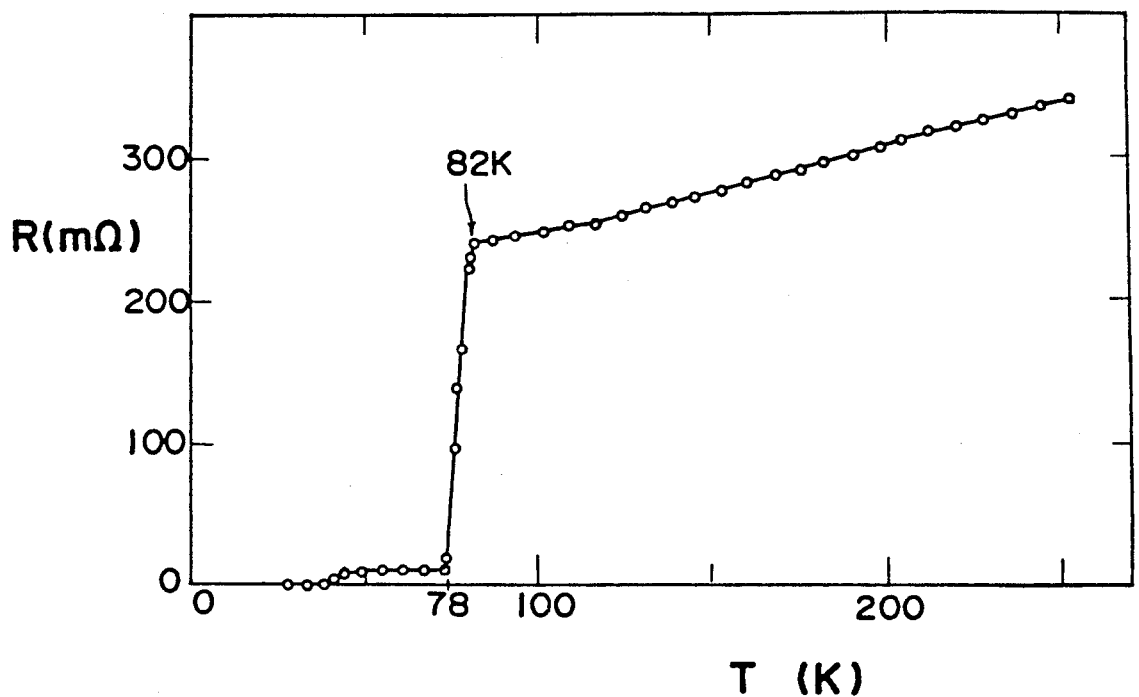
FIG. 41 is a graph showing the resistance of said another superconductor as a function of the absolute temperature.
Figure 45:
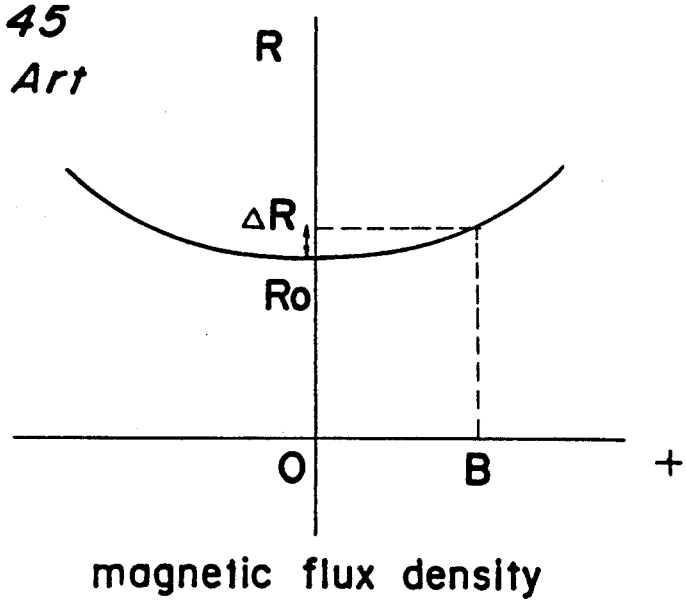
FIG. 45 is a graph showing the magneto-resistive property of a conventional magnetic sensor.

This superconductive material has a resistance which begins to fall down steeply at 82 K and has a very small but finite intrinsic resistance $R_0$ (equal to 12 mΩ) at 78 K, as shown in FIG. 41. The resistance becomes zero at 38 K.

The device cut from the pellet is immersed into liquid nitrogen and the magneto-resistive property is measured while applying a constant current of 5 mA to the device. This measured magneto-resistive property is shown in FIG. 40.

As is apparent form comparison of FIG. 40 with FIG. 9, the superconductive material of this kind can be utilized as a device sensitive to a magnetic field since it has a high sensitivity to a weak magnetic field similarly to the superconductive material having a component of $Y_1Ba_2Cu_3O_{7-x}$.

The production method of the device is not limited to the sintering method mentioned above.

Figure 42:
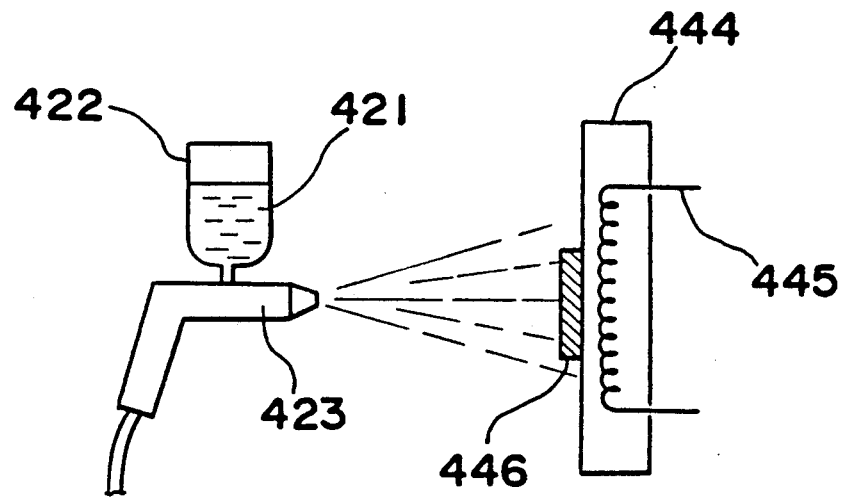
FIG. 42 is an explanative view showing a manufacturing method of the device according to the present invention.

A thin device can be easily produced according to the spray-pyrolysis method, as shown in FIG. 42.

$Y_{(NO_3)_3} \cdot 6H_2O$, $Ba(NO_3)_2$ and $Cu(NO_3)_2 \cdot 3H_2O$ are prepared and weighed at a predetermined ratio in order to obtain a component of $Y_1Ba_2Cu_3O_{7-x}$. Then, they are solved into pure water completely. The solvent 421 is poured into a container 422 of a spray gun apparatus 423 and sprayed by a small amount from the spray gun on a crystal substrate 444 of stabilized zirconia which is heated at about 600° C. by a heater 445. The solvent is sprayed by pressurized air as mists on the substrate.

This spraying is done by a small amount in order to avoid possible lowering of the temperature of the substrate 444 and repeated about one hundred times to obtain a thin film 446 of about 10 μm thickness. In place of air, $N_2$ or $O_2$ gas can be used for spraying. The thickness of the film can be controlled from 0.5 μm to 50 μm. The temperature of the substrate can be altered in a range from 300° to 600° C.

The obtained film is heated at 950° C. for 30 minutes and cooled gradually to a room temperature. The sintering temperature can be varied in a range from 900° to 1,000° C. and the sintering time can be varied in a range from 1 to 60 minutes in accordance with the thickness thereof.

Figure 43:
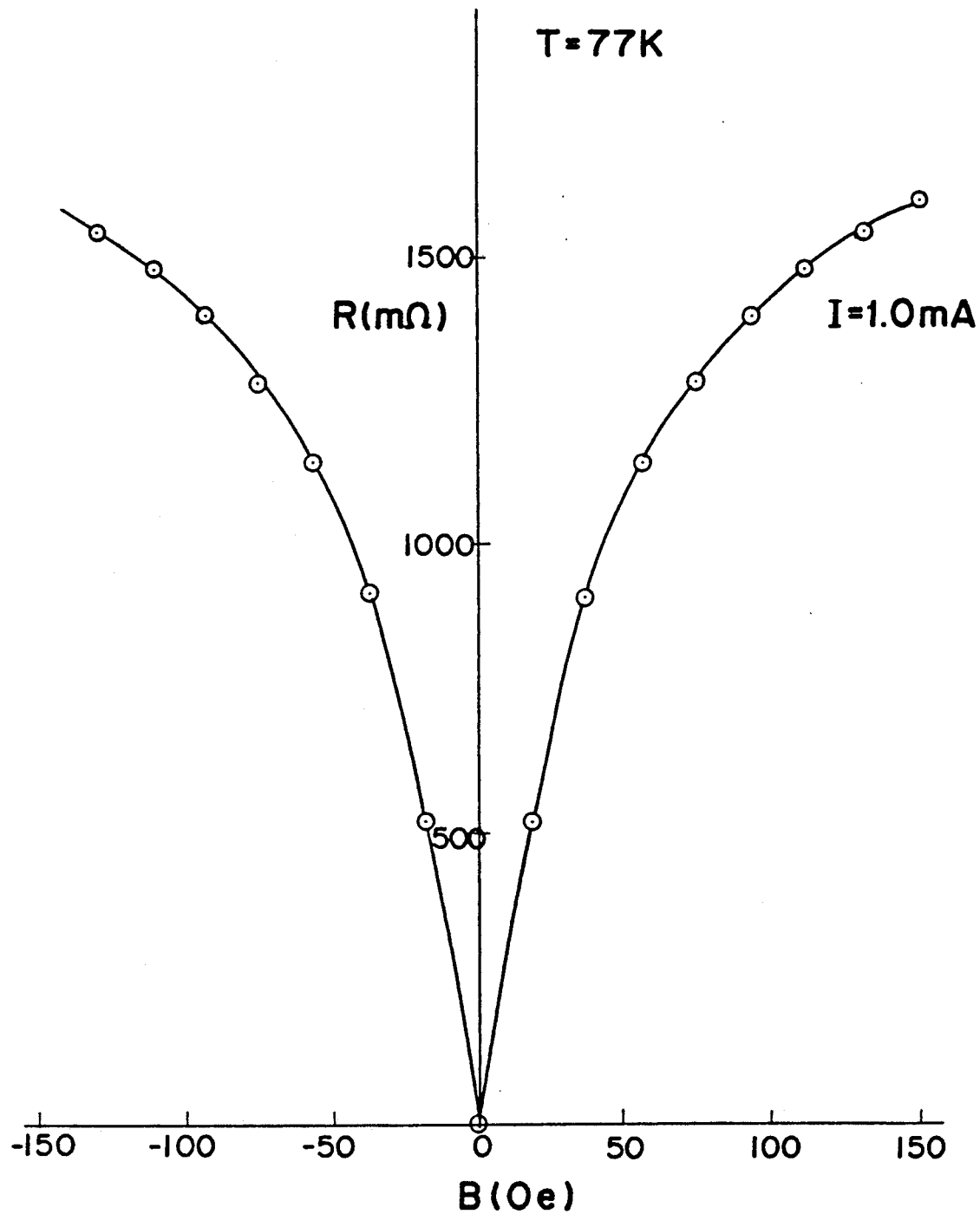
FIG. 43 is a graph showing the magneto-resistive property of the device manufacutured by the method shown in FIG. 42.

The magneto-resistive property of the device thus produced is shown in FIG. 43.

As is apparent form comparison of FIG. 43 with FIG. 9 which shows the magneto-resistive property of the device produced by the powder-sintering method, the former device has an amazingly high sensitivity (resistivity) when compared with that of the latter one.

It is also possible to calcine a thin film in air at a temperature in a range from 750° to 850° C. whenever the thickness of sprayed layer becomes to a predetermined thickness in a range from 1 to 3 μm.

A substrate of $SrTiO_3$ having very few defects can be used in place of the crystal substrate of zirconia.

It is also possible to form a buffer layer on the substrate. Such a buffer layer can be formed with use of sapphire, an oxide such as MgO, $Al_2O_3$, a semiconductive material such as GaAs, Si, or a metal such as Ag, Pt, Y or Ba.

The superconductive film has such an orientation of crystal axis that the direction of growth is oriented in the direction of c axis on the substrate.

FIG. 44 shows an X-ray diffraction pattern of the superconductive film. As shown clearly therein, diffraction peaks appear only at diffraction angles having indexes of c axis.

Although only Y-Ba-Cu-O ceramic superconductive material are described in the above, a ceramic superconductive material comprised of a group IIIa element, group IIa element Cu and O such as La-Ba-Cu-O or Y-Sr-Ba-Cu-O (or part of O elements which is replaced by elements) can be used as the material. Alternatively, a superconductive material having a multi-crystal structure which has random grain boundaries acting as weak couplings can be used.

Further the production method of a superconductive device is not limited to the powder-sintering method and/or the spray-pyrolysis method and various method such as the sputtering method, CVD method, the screen method and doctor-blade method can be utilized.

The preferred embodiments described herein are illustrative and not restrictive, the scope of the invention being indicated by the appended claims and all variations which come within the meanings of the claims are intended to be embraced herein.

What is claimed is:

1. A method for sensing a magnetic field which comprises:
   (a) applying a magnetic field to a superconductive material having grain boundaries, the application of said magnetic field being accompanied with a phase transition of said superconductive material from a superconductive phase to a normal conductive phase; and
   (b) sensing said magnetic field by detecting a change in the resistance of said superconductive material which change in resistance is accompanied with the phase transition of said superconductive material from the superconductive phase to the normal conductive phase.

2. A method for sensing a magnetic field which comprises:
   (a) applying a magnetic field to a superconductive material having grain boundaries by applying current to said superconductive material having grain boundaries;
   (b) applying an external magnetic field to said superconductive material having grain boundaries, accompanied with a phase transition of said superconductive material from a superconductive phase to a normal conductive phase; and
   (c) sensing said external magnetic field by detecting a change in the resistance of said superconductive material having grain boundaries which is accompanied with the phase transition of said superconductive material from the superconductive phase to the normal conductive phase.

3. A method for sensing a magnetic field which comprises:
   (a) supplying a current through a superconductive material having grain boundaries;
   (b) applying a magnetic field to said superconductive material, said magnetic field causing a phase transition of said superconductive material from a superconductive phase to a normal conductive phase; and
   (c) detecting a change in the resistance of said superconductive material as an indication of said magnetic field, said change being accompanied with the phase transition of said superconductive material from the superconductive phase to the normal conductive phase.

4. A superconductive magneto-resistive device comprising:
   a superconductive material having grain boundaries which act as weak couplings; and
   means for operatively connecting said superconductive material to use the change in resistance of said superconductive material when a magnetic field is applied to said superconductive material.

5. A superconductive magneto-resistive device as claimed in claim 4, wherein said superconductive material is IIIa-IIa-Cu-O ceramic superconductive material.

6. A superconductive magneto-resistive device as claimed in claim 4, wherein said means for operatively connecting said superconductive uses the change in resistance in said superconductive for sensing an external magnetic field applied to said superconductive material.

7. A superconductive magneto-resistive device as claimed in claim 4, wherein said means for operatively connecting measures the resistance of said superconductive material as an indication of an external magnetic field applied to said superconductive material.

8. A superconductive magneto-resistive device as claimed in claim 4, wherein said means for operatively connecting is a waveguide.

9. A superconductive magneto-resistive device as claimed in claim 8, wherein said superconductive material is physically attached to said waveguide.

10. A superconductive device as claimed in claim 8, wherein said waveguide is a microwaveguide.

11. A superconductive magneto-resistive device as claimed in claim 4, wherein said means for operatively connecting is a magnetic head for sensing magnetic fields recorded in a recording medium.

12. A superconductive magneto-resistive device as claimed in claim 4, wherein said means for operatively connecting is a position sensor for detecting a position of an object.

13. A superconductive magneto-resistive device as claimed in claim 12, wherein said position sensor is a one-dimensional position sensor.

14. A superconductive magneto-resistive device as claimed in claim 12, wherein said position sensor is a two-dimensional position sensor.

15. A superconductive magneto-resistive device as claimed in claim 4, wherein said means for operatively connecting is a potentiometer.

16. A superconductive magneto-resistive device as claimed in claim 4, wherein said means for operatively connecting is a transformer.

17. A superconductive magneto-resistive device as claimed in claim 4, wherein said means for operatively connecting is a gear.

18. A system for using a superconductive magneto-resistive device comprising:
   a superconductive material having grain boundaries;
   means for applying a magnetic field to said superconductive material; and
   means for measuring the resistance of said superconductive material as an indication of an external magnetic field applied to said superconductive material, said resistance being accompanied with a phase transition of said superconductive material from the superconductive material from the superconductive phase to the normal conductive phase.

19. A system for using a superconductive magneto-resistive device as claimed in claim 18, wherein said means for applying a magnetic field applies a constant magnetic field to said superconductive material.

20. A system for using a superconductive magneto-resistive device as claimed in claim 18, wherein said means for applying a magnetic field applies a variable magnetic field to said superconductive material.

21. A system for using a superconductive magneto-resistive device as claimed in claim 18, wherein said means for applying a magnetic field includes means for supplying electrical current to said superconductive material.

22. A system for using a superconductive magneto-resistive device as claimed in claim 18, wherein said means for measuring the resistance is means for detecting a voltage generated in said superconductive material when said magnetic field is applied thereto.

23. A system for using a superconductive magneto-resistive device comprising:
   a superconductive material having grain boundaries;
   means for supplying an electric current through said superconductive material;
   means for measuring the resistance of said superconductive material as an indication of an external magnetic field applied to said superconductive material, wherein a change in resistance of said superconductive material is accompanied with a phase transition of said superconductive material from the superconductive phase to the normal conductive phase.

24. A system for using a superconductive magneto-resistive device as claimed in claim 23, wherein said mean for supplying an electric current is means for supplying a constant electric current.

25. A system for using a superconductive magneto-resistive device as claimed in claim 23, wherein said means for supplying an electric current is means for supplying a variable electric current.

26. A system for using a superconductive magneto-resistive device as claimed in claim 25, wherein said variable electric current is a current varied from the value zero.

27. A system for using a superconductive magneto-resistive device as claimed in claim 25, wherein said variable electric current is a pulse current.

28. A system for using a superconductive magneto-resistive device as claimed in claim 27, wherein said pulse current is a saw tooth pulse current.

* * * * *